US012588244B2

(12) United States Patent
Chang et al.

(10) Patent No.: US 12,588,244 B2
(45) Date of Patent: Mar. 24, 2026

(54) SEMICONDUCTOR DEVICES AND METHODS OF FABRICATION THEREOF

(71) Applicant: TAIWAN SEMICONDUCTOR MANUFACTURING COMPANY, LTD., Hsinchu (TW)

(72) Inventors: Cheng-Wei Chang, Taipei (TW); Shahaji B. More, Hsinchu (TW); Chi-Yu Chou, Hsinchu (TW); Yueh-Ching Pai, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 405 days.

(21) Appl. No.: 18/104,480

(22) Filed: Feb. 1, 2023

(65) Prior Publication Data

US 2024/0105787 A1 Mar. 28, 2024

Related U.S. Application Data

(60) Provisional application No. 63/410,335, filed on Sep. 27, 2022.

(51) Int. Cl.
| | |
|---|---|
| *H10D 30/67* | (2025.01) |
| *H01L 21/285* | (2006.01) |
| *H01L 21/311* | (2006.01) |
| *H10D 30/01* | (2025.01) |
| *H10D 30/43* | (2025.01) |
| *H10D 62/10* | (2025.01) |
| *H10D 62/13* | (2025.01) |
| *H10D 64/01* | (2025.01) |
| *H10D 64/62* | (2025.01) |

(52) U.S. Cl.
CPC ... *H10D 30/6729* (2025.01); *H01L 21/28518* (2013.01); *H01L 21/31116* (2013.01); *H10D 30/014* (2025.01); *H10D 30/0215* (2025.01); *H10D 30/43* (2025.01); *H10D 30/6735* (2025.01); *H10D 62/121* (2025.01); *H10D 62/151* (2025.01); *H10D 64/017* (2025.01); *H10D 64/62* (2025.01)

(58) Field of Classification Search
CPC ............. H10D 30/6729; H10D 30/014; H10D 62/121; H10D 64/017; H10D 62/151; H10D 30/6735; H10D 64/32; H10D 30/0215; H10D 30/43; H01L 21/28518; H01L 21/31116
See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |

(Continued)

FOREIGN PATENT DOCUMENTS

| | | |
|---|---|---|
| TW | 202125826 A1 | 7/2021 |
| TW | 202211334 A | 3/2022 |
| TW | 202234588 A | 9/2022 |

*Primary Examiner* — Christine A Enad
(74) *Attorney, Agent, or Firm* — NZ Carr Law Office

(57) ABSTRACT

Embodiments of the present disclosure provide a method of forming a contact opening using selective ALE operations to remove ILD layer along an upper profile of a source/drain region, and then form a source/drain contact feature having a concave bottom profile with increased contact area.

20 Claims, 43 Drawing Sheets

(56)  References Cited

U.S. PATENT DOCUMENTS

| | | | |
|---|---|---|---|
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2017/0278743 A1* | 9/2017 | Tsai | H01L 21/76814 |
| 2019/0164762 A1* | 5/2019 | Su | H01L 21/76897 |
| 2020/0075724 A1* | 3/2020 | Wang | H10D 64/01 |
| 2021/0376139 A1* | 12/2021 | Huang | H10D 30/62 |
| 2022/0093786 A1 | 3/2022 | Song et al. | |
| 2022/0149177 A1 | 5/2022 | Lee et al. | |
| 2022/0246613 A1 | 8/2022 | Lin et al. | |

* cited by examiner

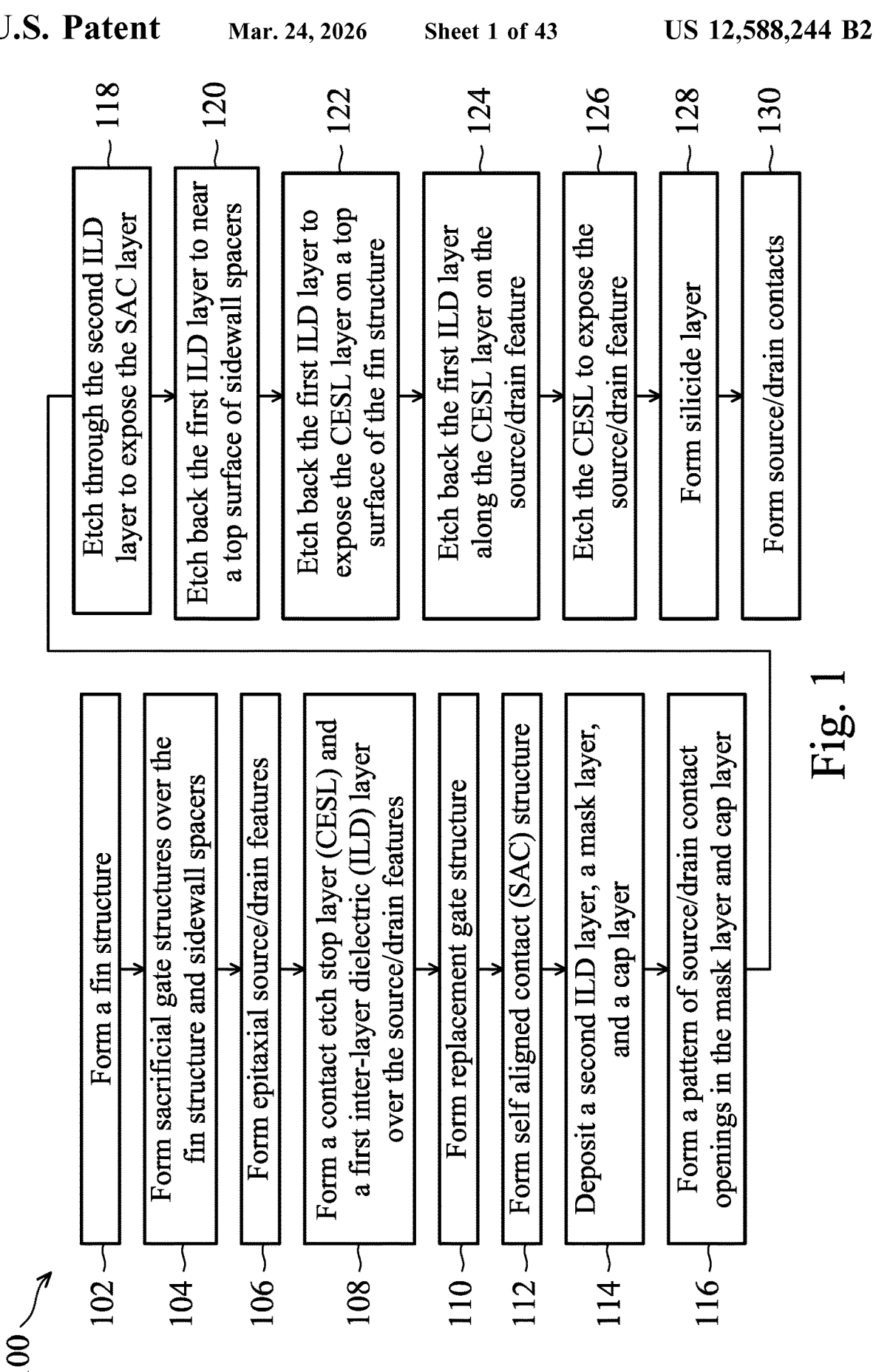

100

102 Form a fin structure

104 Form sacrificial gate structures over the fin structure and sidewall spacers 106 Form epitaxial source/drain features 108 Form a contact etch stop layer (CESL) and a first inter-layer dielectric (ILD) layer over the source/drain features 110 Form replacement gate structure 112 Form self aligned contact (SAC) structure 114 Deposit a second ILD layer, a mask layer, and a cap layer 116 Form a pattern of source/drain contact openings in the mask layer and cap layer 118 Etch through the second ILD layer to expose the SAC layer 120 Etch back the first ILD layer to near a top surface of sidewall spacers 122 Etch back the first ILD layer to expose the CESL layer on a top surface of the fin structure 124 Etch back the first ILD layer along the CESL layer on the source/drain feature 126 Etch the CESL to expose the source/drain feature 128 Form silicide layer 130 Form source/drain contacts

Fig. 1

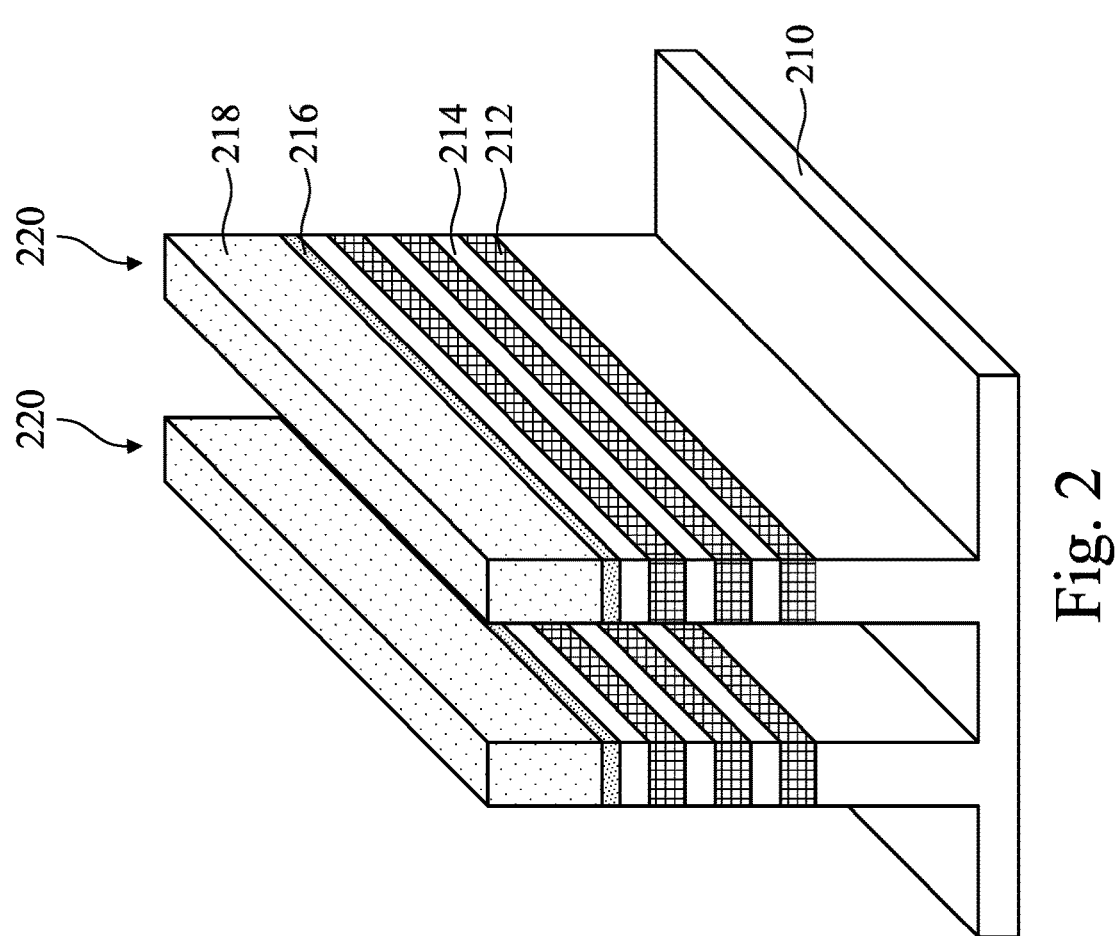
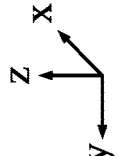
Fig. 2

200

230
228

234
226
224

234

210

232

232

232

220

220

212
214

222
210 z
x
y

200

232

232

232

230
228

234
226
224

234

236s

210

236t

236s

236

222
210 z
x
y

200

C

B

234

226

224

A

A

232

232

232

210

240

238

236

222

210

B

C z x y

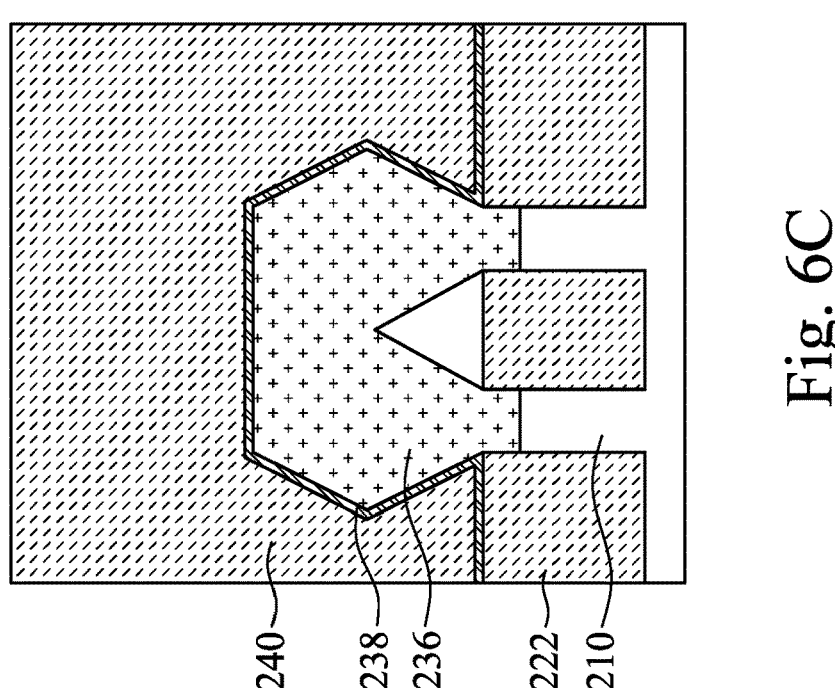
Fig. 6C
Fig. 6B

251b3

251b1

251b2

251b4

T1

T4

T3

T2

240t2

236

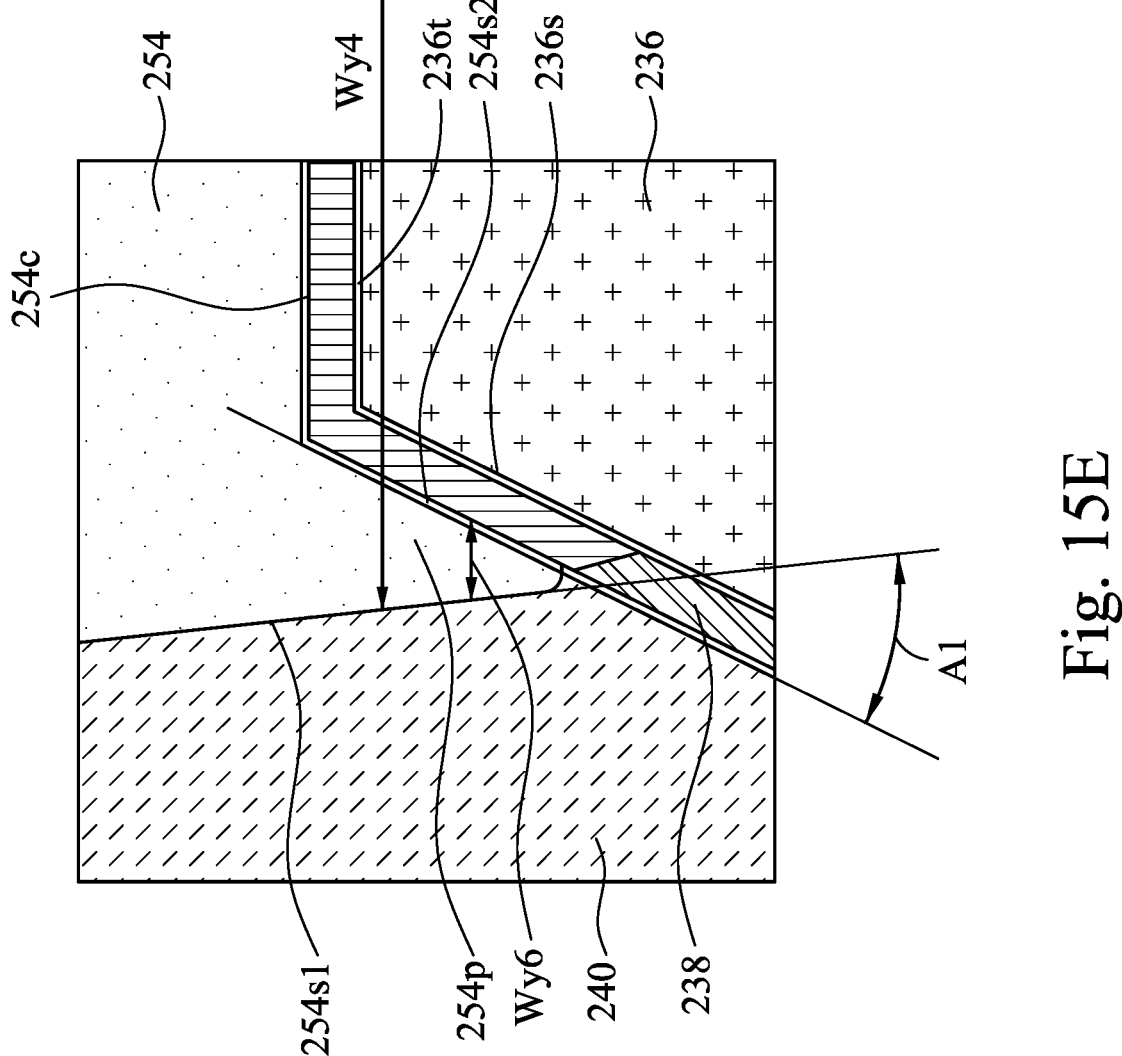
Fig. 15E
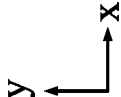

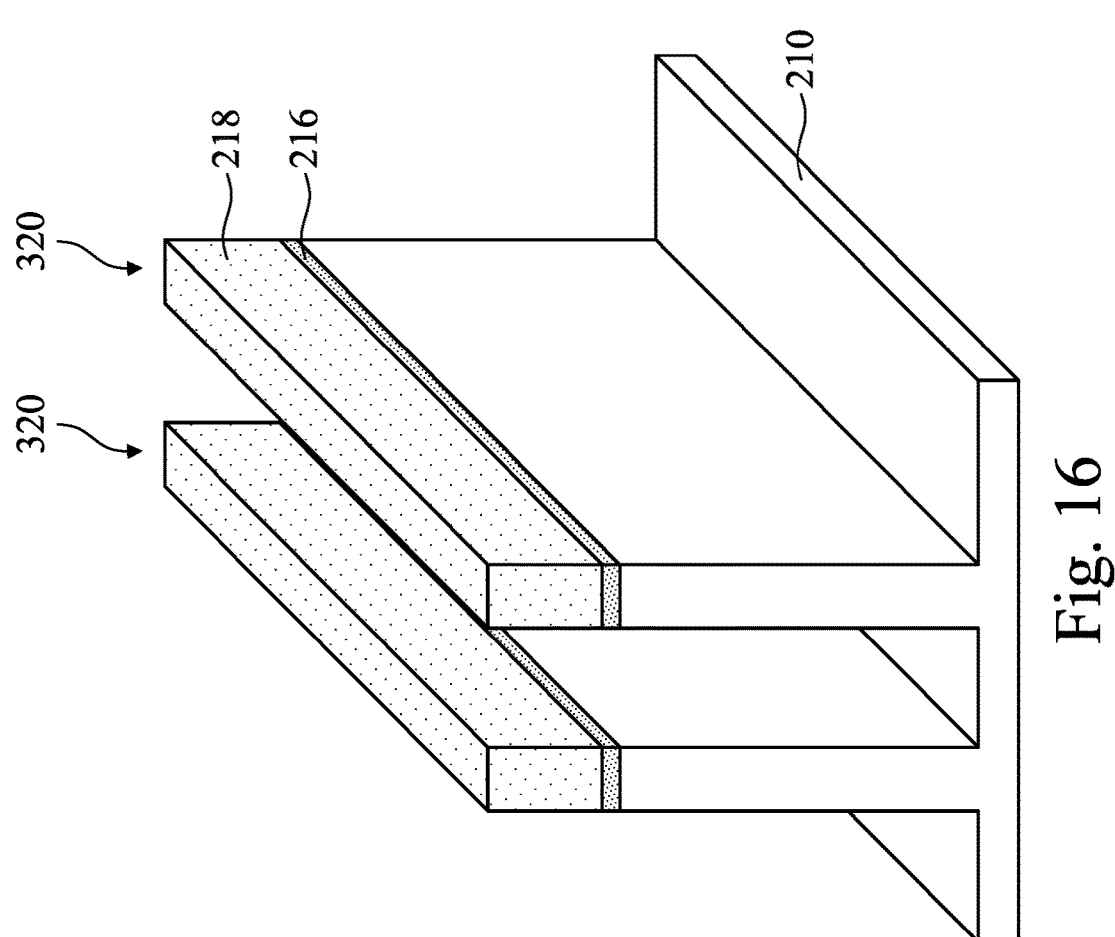
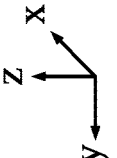
Fig. 16

300

240
238
234t
234
236
210

354
245
250
248
249
252
210

Wx1
Wx2
Wx3

B
B
C
C x
z

SEMICONDUCTOR DEVICES AND METHODS OF FABRICATION THEREOF

CROSS-REFERENCE TO RELATED APPLICATIONS

This application claims priority to U.S. Provisional Application Ser. No. 63/410,335 filed Sep. 27, 2022, which is incorporated by reference in its entirety.

BACKGROUND

An integrated circuit (IC) typically includes a plurality of semiconductor devices, such as field-effect transistors and metal interconnection layers formed on a semiconductor substrate. The semiconductor industry has experienced continuous rapid growth due to constant improvements in the performance of various electronic components, including source and dl contacts and interconnection layers. For the most part, it is desirable to have lower capacitance and lower contact resistance between various components. However, as device dimension shrinks, contact areas between components may shrink as well, which leads to increase in contact resistance. For example, the contact resistance between the source/drain contact features and epitaxial source/drain regions may increase as device dimension reduces.

Embodiments of the present disclosure relate to methods for effectively reducing contact resistance in a semiconductor device, such as the contact resistance between epitaxial source/drain regions and source/drain contact features.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a method for manufacturing of a semiconductor device according to embodiments of the present disclosure.

FIGS. 2-5, 6A-6C, 7A-7D, 8A-8D, 9A-9D, 10A-10D, 11A-11D, 12A-12D, 13A-13E, 14A-14D, and 15A-15E schematically illustrate various stages of manufacturing a semiconductor device according to some embodiments of the present disclosure.

FIGS. 16, 17, and 18A-18C schematically illustrate various stages of manufacturing a semiconductor device according to another embodiment of the present disclosure.

DETAILED DESCRIPTION

Figure 3:
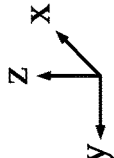

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain region(s) may refer to a source or a drain, individually or collectively dependent upon the context.

FIG. 1 is a flow chart of a method 100 for manufacturing of a semiconductor device according to embodiments of the present disclosure. FIGS. 2-5, 6A-6C, 7A-7D, 8A-8D, 9A-9D, 10A-10D, 11A-11D, 12A-12D, 13A-13E, 14A-14D, and 15A-15D schematically illustrate various stages of manufacturing a semiconductor device 200 according to the method 100. Additional operations can be provided before, during, and after operations/processes in the method 100, and some of the operations described below can be replaced or eliminated, for additional embodiments of the method. The order of the operations/processes may be interchangeable.

The method 100 begins at operation 102, a fin structure 220 is formed over a substrate 210, as shown in FIG. 2. The substrate 210 is provided to form a semiconductor device thereon. The substrate 210 may include a single crystalline semiconductor material such as, but not limited to Si, Ge, SiGe, GaAs, InSb, GaP, GaSb, InAlAs, InGaAs, GaSbP, GaAsSb, and InP. The substrate 210 may include various doping configurations depending on circuit design. For example, different doping profiles, e.g., n-wells, p-wells, may be formed in the substrate 210 in regions designed for different device types, such as nFET and pFET. In some embodiments, the substrate 210 may be a silicon-on-insulator (SOI) substrate including an insulator structure (not shown) for enhancement.

To form the fin structure 220, one or more pairs of first semiconductor layer 212 and second semiconductor layer 214 are formed over the substrate 210. The semiconductor layers 212, 214 may be formed by a molecular beam epitaxy (MBE) process, a metalorganic chemical vapor deposition (MOCVD) process, and/or other suitable epitaxial growth processes. In some embodiments, the semiconductor layers 214 include the same material as the substrate 210. In some embodiments, the semiconductor layers 212 and 214 include different materials than the substrate 210. In some embodiments, the semiconductor layers 212 and 214 are made of materials having different lattice constants. The first semiconductor layers 212 in channel regions may eventually be removed and serve to define a vertical distance between adjacent channel regions for a subsequently formed multigate device. In some embodiments, the first semiconductor layers 212 include an epitaxially grown silicon germanium (SiGe) layer and the second semiconductor layers 214 include an epitaxially grown silicon (Si) layer. Alternatively, in some embodiments, either of the semiconductor layers 212 and 214 may include other materials such as Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

The fin structure 220 is formed by patterning a pad layer 216 and a hard mask 218 formed on the pairs of semiconductor layers 212, 214, and then etching through the pairs of semiconductor layers 212, 214 and a portion of the substrate 210.

In operation 104, sacrificial gate structures 232 are formed over the fin structure 220, and sidewall spacers 234 are formed on sides of the sacrificial gate structure 232, as shown in FIG. 3.

Figure 4:
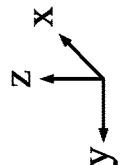

After formation of the fin structure 220, an isolation layer 22 is formed in trenches between the fin structure 220, as shown in FIG. 4. The isolation layer 22 is formed over the substrate 210 and then etched back to expose the pairs of semiconductor layers 212, 214. In some embodiments, the isolation layer 222 may include silicon oxide, silicon nitride, silicon oxynitride, fluorine-doped silicate glass (FSG), a low-k dielectric, combinations thereof.

The sacrificial gate structures 232 may include a sacrificial gate dielectric layer 224, a sacrificial gate electrode layer 226, a pad layer 228, and a mask layer 230. The sacrificial gate dielectric layer 24 may include one or more layers of dielectric material, such as $SiO_2$, SiN, a high-k dielectric material, and/or other suitable dielectric material. The sacrificial gate electrode layer 226 may include silicon such as polycrystalline silicon or amorphous silicon. The pad layer 228 may include silicon nitride. The mask layer 230 may include silicon oxide. Next, a patterning operation is performed on the mask layer 230, the pad layer 228, the sacrificial gate electrode layer 226 and the sacrificial gate dielectric layer 224 to form the sacrificial gate structure 232.

The sidewall spacers 234 are formed on sidewalls of each sacrificial gate structure 232. The sidewall spacers 234 may be formed from a dielectric material, such as SiO, SiN, SiC, SiCN, SiOC, SiON, SiOCN, or a combination thereof. In some embodiments, the insulating material of the sidewall spacers 234 is a silicon nitride-based material, such as SiN, SiON, SiOCN or SiCN and combinations thereof. In some embodiments, a thickness of the sidewall spacer 234 is in a range between about 0.5 nm and about 10 nm.

In operation 106, source/drain regions 236 are formed opposing sides of the sacrificial gate structures 232, as shown in FIG. 4. The operation 106 may include etching back portions of the fin structure 220 exposed outside the sacrificial gate structures 232, etching back the first semiconductor layers 212 from under the sidewall spacers 234 to form inner spacer cavities, forming inner spacers 235 (shown in FIG. 6A) in the inner spacer cavities, and epitaxially growing the source/drain regions 236 from the exposed surface of the substrate 210 and the second semiconductor layers 214.

The inner spacers 235 may be formed from a dielectric material, such as SiO, SiN, SiC, SiCN, SiOC, SiON, SiOCN, or a combination thereof. In some embodiments, the inner spacers 235 may include one of silicon nitride (SiN) and silicon oxide ($SiO_2$), SiONC, or a combination thereof.

The source/drain regions 236 may include one or more semiconductor materials depending on the device type. The source/drain regions 236 may be epitaxially grown material with a thickness in a range between about 0.5 nm to about 30 nm.

For n-type devices, the source/drain regions 236 may include one or more layers of Si, SiP, SiC, SiCP, or a group III-V material (InP, GaAs, AlAs, InAs, InAlAs, InGaAs). In some embodiments, the source/drain regions 236 may be doped with n-type dopants, such as phosphorus (P), arsenic (As), etc, for n-type devices.

For p-type devices, the source/drain regions 236 may include one or more layers of Si, SiGe, SiGeB, Ge, or a group III-V material (InSb, GaSb, InGaSb). In some embodiments, the source/drain regions 236 may be doped with p-type dopants, such as boron (B).

The source/drain regions 236 are formed by epitaxial growth from exposed semiconductor surfaces, such as from the substrate 210 and the semiconductor layers 214. Depending on geometry shape of the source/drain opening and the process parameters, the source/drain regions 236 may have various shapes. In some embodiments, the source/drain regions 236 grown from neighboring fin structures 220 are connected forming one source/drain feature. It should be noted that, depending to the layout design and circuit design, the source/drain regions 236 may be separately formed or joined together across more than two fin structures. In the cross section along y-z plane, the source/drain region 236 may extend upward from one or more fin structures 220, combined into a wider middle section, and then terminate at a narrower upper portion. As shown in FIG. 4, in the y-z cross section, the source/drain region 236 has a convex upper profile, which includes a top surface 236t and two side surfaces 236s. The top surface 236t, defining the narrower upper portion, may include one or more substantially planar sections. The side surfaces 236s, connecting the wider middle portion to the narrower upper portion, have a downward slope.

Figure 5:
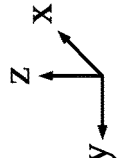

In operation 108, a contact etch stop layer (CESL) 238 and an interlayer dielectric (ILD) layer 240 are formed over the exposed surfaces as shown in FIG. 5. In the example, the CESL 238 is formed on the source/drain regions 236, the sidewall spacers 234, and the isolation layer 222. The CESL 238 may include $Si_3N_4$, SiON, SiCN or any other suitable material, and may be formed by CVD, PVD, or ALD. In some embodiments, the CESL 238 may be formed from a material different from the sidewall spacers 234 so that the sidewall spacers 234 can be selectively etched back in the subsequent process to form SAC layers.

The interlayer dielectric (ILD) layer 240 is formed over the contract etch stop layer (CESL) 238. The materials for the ILD layer 240 include compounds comprising Si, O, C, and/or H, such as silicon oxide, SiCOH and SiOC. Organic materials, such as polymers, may be used for the ILD layer 240. In some embodiments, the ILD layer 240 includes silicon oxide. The ILD layer 240 protects the source/drain regions 236 during the removal of the sacrificial gate structures 232. A planarization operation, such as CMP, is performed to expose the sacrificial gate electrode layer 226 for subsequent removal of the sacrificial gate structures 232.

Figure 6A:
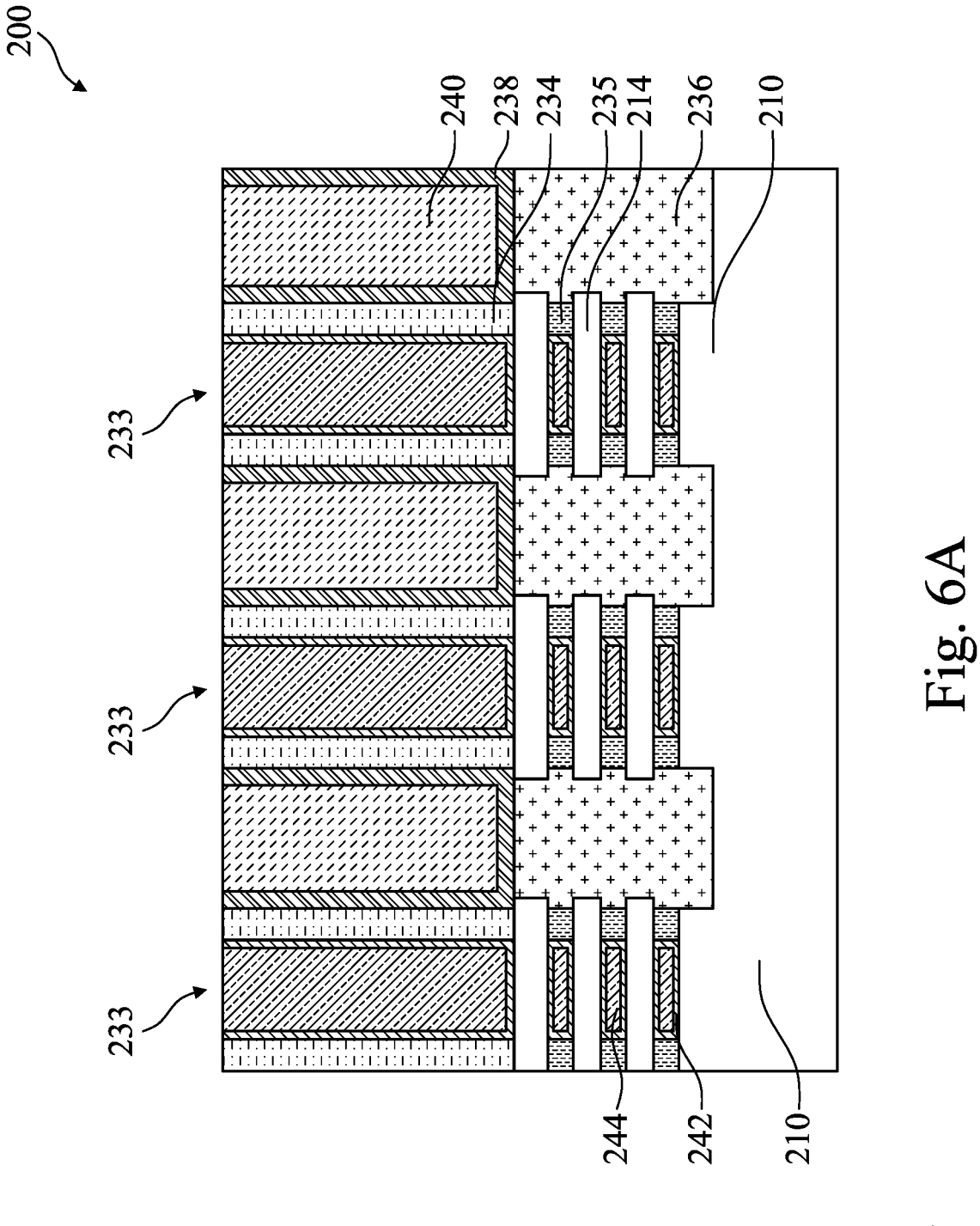

In operation 110, a replacement gate sequence is performed to form a gate dielectric layer 242 and the gate electrode layer 244 as shown in FIGS. 6A-6C. FIG. 6A is a schematic cross sectional view of the semiconductor device 200 along A-A line of FIG. 5. FIG. 6B is a schematic cross sectional view of the semiconductor device 200 along B-B line of FIG. 5. FIG. 6C is a schematic cross sectional view of the semiconductor device 200 along C-C line of FIG. 5.

The replacement gate sequence may include removing the sacrificial gate electrode layer 226 and the sacrificial gate dielectric layer 224 to expose the fin structure 220 under the sacrificial gate structure 232. The first semiconductor layers 212 are subsequently removed resulting forming nanosheets of the second semiconductor layers 214.

The gate dielectric layer 242 is then deposited on exposed surfaces of each nanosheet of the second semiconductor layers 214, exposed surfaces of the inner spacers 235, and exposed surfaces of the sidewall spacers 234. The gate dielectric layer 242 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrode layer 244 is then deposited formed over the gate dielectric layer 242. The gate electrode layer 244 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. After the formation of the gate electrode layer 244, a planarization process, such as a CMP process, is performed to remove excess deposition of the gate electrode material and expose the top surface of the ILD layer 240.

As shown in FIG. 6A, the one or more second semiconductor layers 214 connect the source/drain regions 236 on opposing sides of the one or more second semiconductor layers 214 forming a multichannel transistor. The one or more semiconductor layers 214 function as a channel region between the source/drain regions 236 of the multi-channel transistor. The connection between the source/drain regions 236 may be controlled by the voltage applied to the gate electrode layer 244. Alternatively, the channel region may be a single channel transistor with a single channel fin-shape channel region or a planar channel region.

Figure 7A:
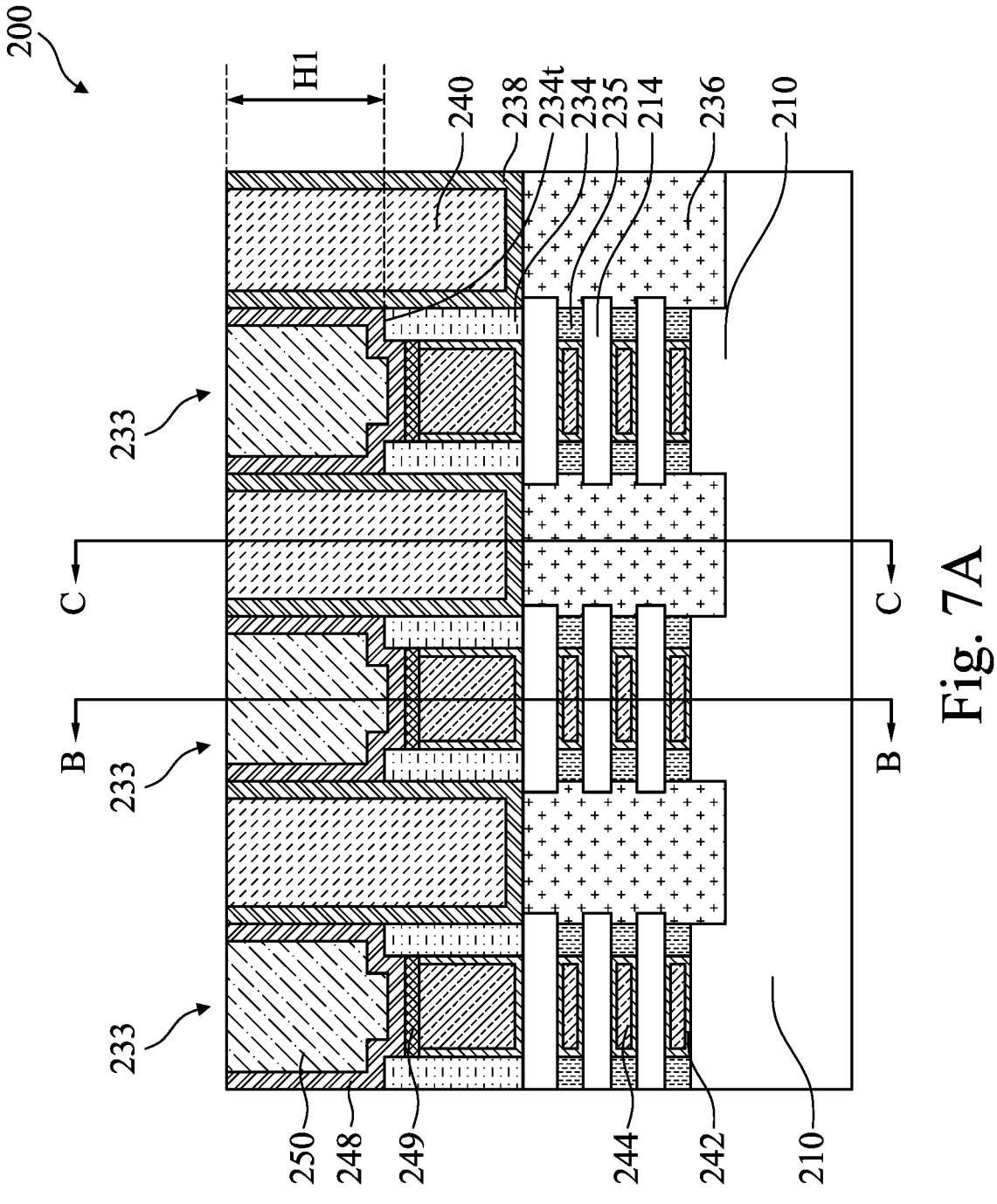
Figures 7B, 7C:
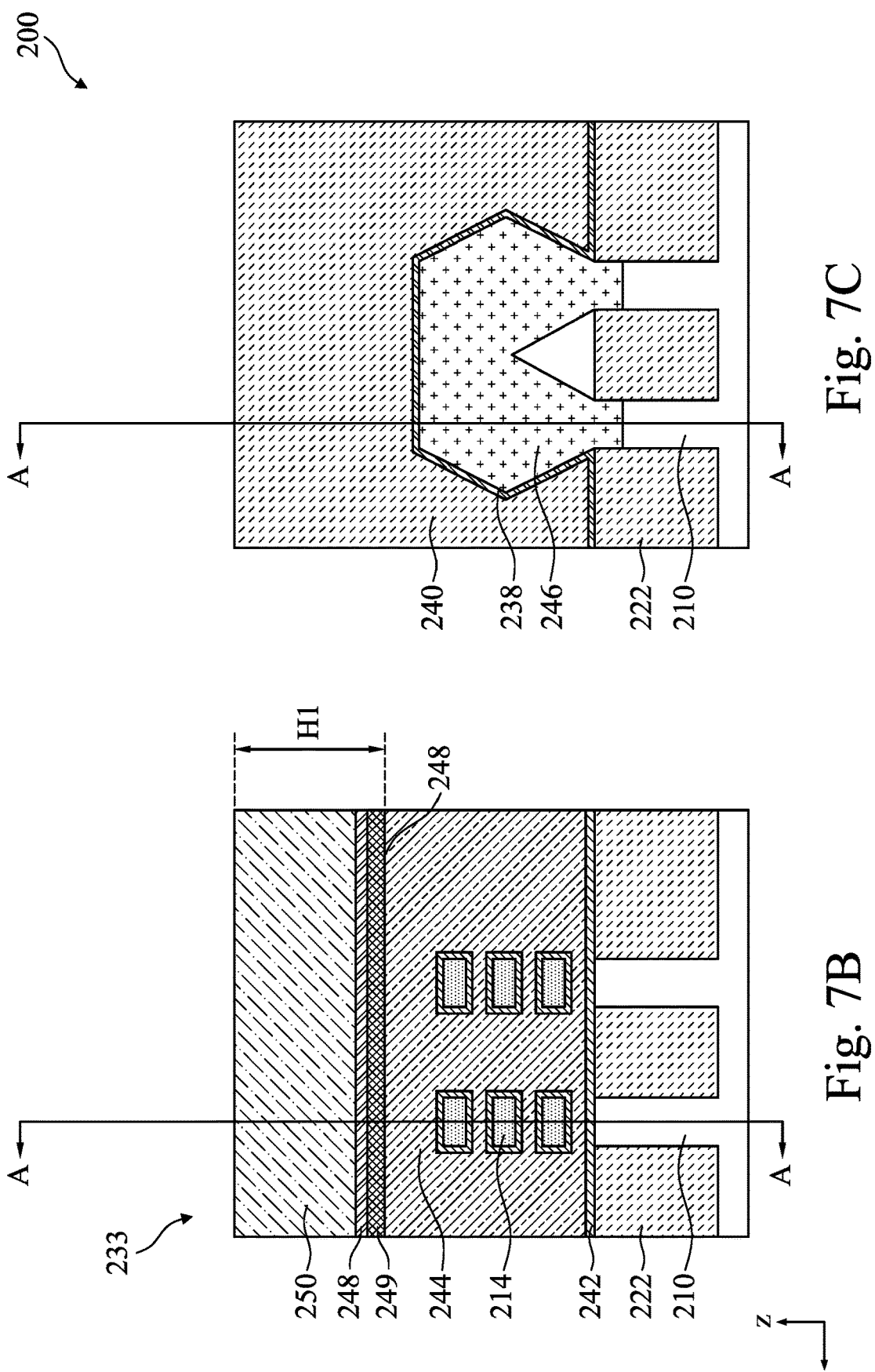
Figure 7D:
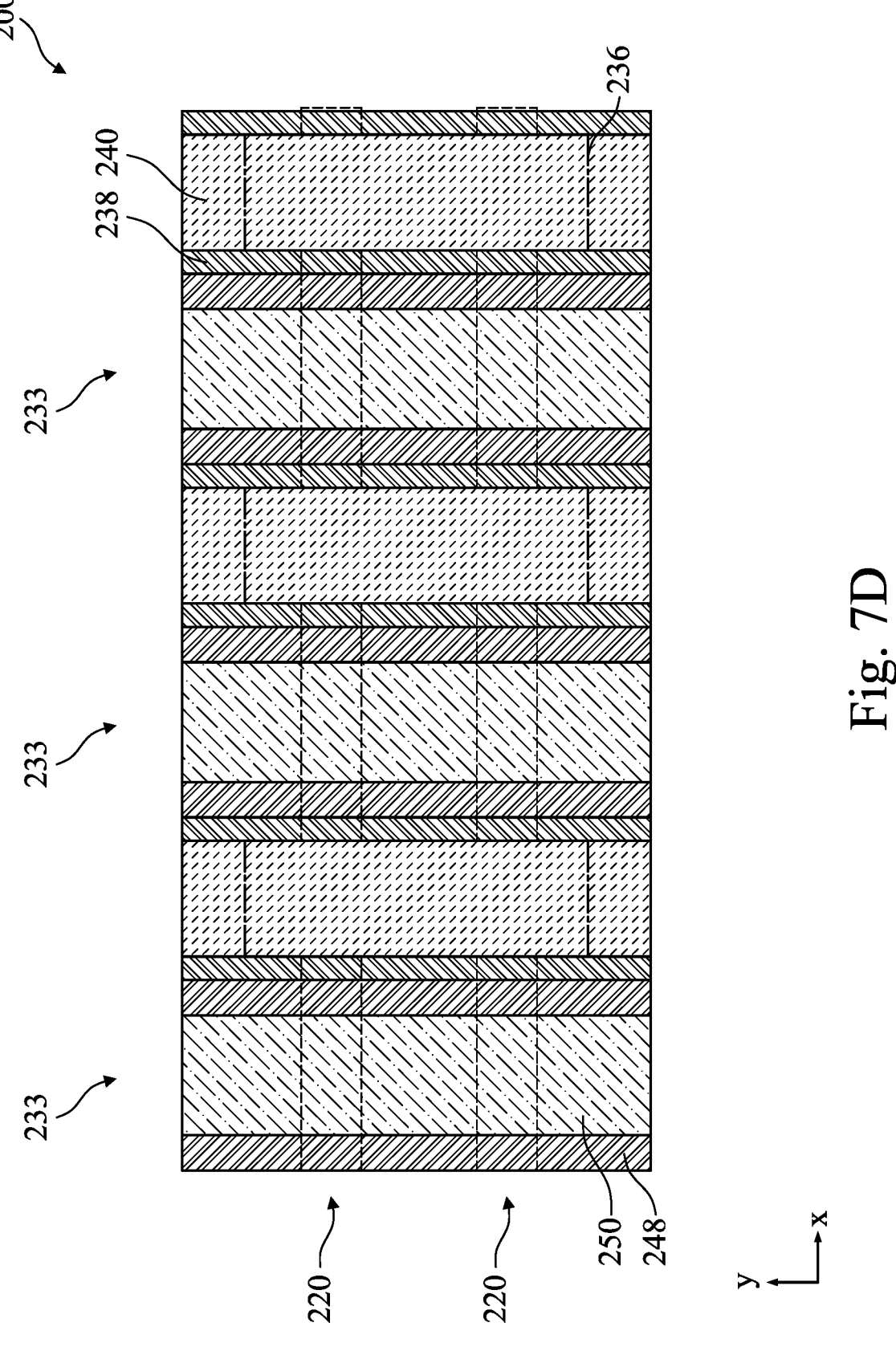

In operation 112, a self-aligned contact (SAC) layer 250 is formed on an upper portion of the replacement gate structures 233, as shown in FIGS. 7A-7D. FIG. 7A is a schematic cross sectional view of the semiconductor device 200 along A-A line of FIGS. 7B and 7C. FIG. 7B is a schematic cross sectional view of the semiconductor device 200 along B-B line of FIG. 7A. FIG. 7C is a schematic cross sectional view of the semiconductor device 200 along C-C line of FIG. 7A. FIG. 7D is a schematic plan view of the semiconductor device 200.

A metal gate etching back (MGEB) process is performed to remove portions of the gate dielectric layer 242 and the gate electrode layer 244. Trenches are formed in the region above the remaining gate electrode layer 244. The MGEB process may be a plasma etching process employing one or more etchants such as chlorine-containing gas, a brominecontaining gas, and/or a fluorine-containing gas. The etching process allows the gate dielectric layer 242 and the gate electrode layer 244 to be selectively etched from the ILD layer 240 and the CESL 238.

In some embodiments, the sidewall spacers 234 are also etched back to a level be lower than the CESL 238 and higher than the gate electrode layer 244. By etching the sidewall spacers 234 below the CESL 238, the sidewall spacers 234 can be covered and protected by the subsequently formed SAC layer 250 while forming source/drain metal contacts. By keeping the sidewall spacers 234 at a level higher than the gate electrode layer 244 and gate dielectric layer 242, the gate electrode layer 244 remain protected by the sidewall spacers 234. The sidewall spacers 234 may be etched back during the MGEB process or in a separate etching process.

In some embodiments, a cap layer 249 may be formed over the gate electrode layer 244 after the gate electrode layer 244 is etched back. The cap layer 249 may be selectively formed over the exposed surface of the gate electrode layer 244. In some embodiments, the cap layer 249 may include tungsten.

In some embodiments, after the MGEB process, a metal gate liner 248 may be first deposited on exposed surfaces in the trenches prior to filling the trenches with the SAC layer 250. The metal gate liner 248 and the SAC layer 250 may be formed by a suitable deposition process, such as CVD, PVD, or ALD. After filling the trenches with the SAC layer 250, a planarization process, such as a CMP process, is performed to remove excess deposition of the SAC layer 250 and metal gate liner 248 to expose the top surface of the ILD layer 240. As shown in FIG. 7A, the ILD layer 240 and the SAC layer 250 are substantially co-planar after operation 112.

The metal gate liner 248 may function as a diffusion barrier for the gate electrode layer 244. The metal gate liner 248 may be a dielectric layer including but not limited to SiO, SiN, SiC, SiCN, SiOC, SiON, SiOCN, ZrO, ZrN, or a combination thereof. The metal gate liner 248 may have a thickness in a range between about 0.5 nm and 10 nm. A metal gate liner 248 thinner than 0.5 nm may not be able to function as a barrier. A metal gate liner 248 thicker than 10 nm may increase dimension of the device without additional benefit.

The SAC layer 250 may be any dielectric layer that can be used as an etch stop layer during subsequent trench and via patterning for metal contacts. The SAC layer 50 may be a dielectric layer including but not limited to SiO, HfSi, SiOC, AlO, ZrSi, AlON, ZrO, HfO, TiO, ZrAlO, ZnO, TaO, LaO, YO, TaCN, SiN, SiOCN, Si, SiOCN, ZrN, SiCN, or any combinations thereof. In some embodiments, the SAC layer 250 may a high-k dielectric layer. In some embodiments, the SAC layer 250 includes silicon nitride. In some embodiments, the SAC layer 250 may have a height H1 in a range between about 0.5 nm and about 30 nm. A SAC layer 50 thinner than 0.5 nm may not be able to function as an etch stop layer in the subsequent process. A SAC layer 250 thicker than 30 nm may increase dimension of the device without additional benefit.

FIG. 7D schematically illustrates a plan view of the semiconductor device 200 after formation of the SAC layer 250. Locations of the fin structures 220 and source/drain regions 236, which are covered under the SAC layer and the ILD layer 240, are marked in dashed lines.

Figure 8A:
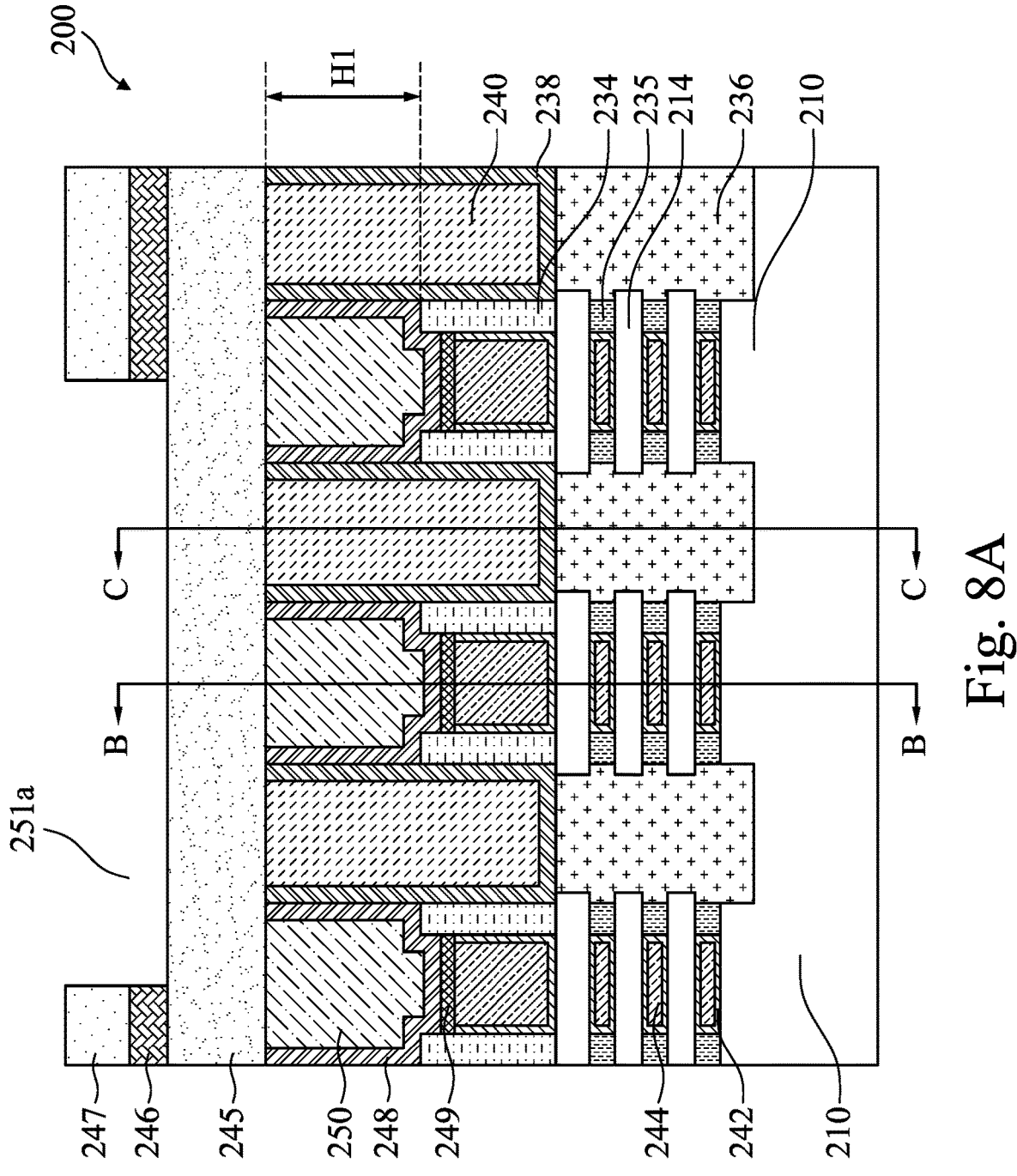
Figures 8B, 8C:
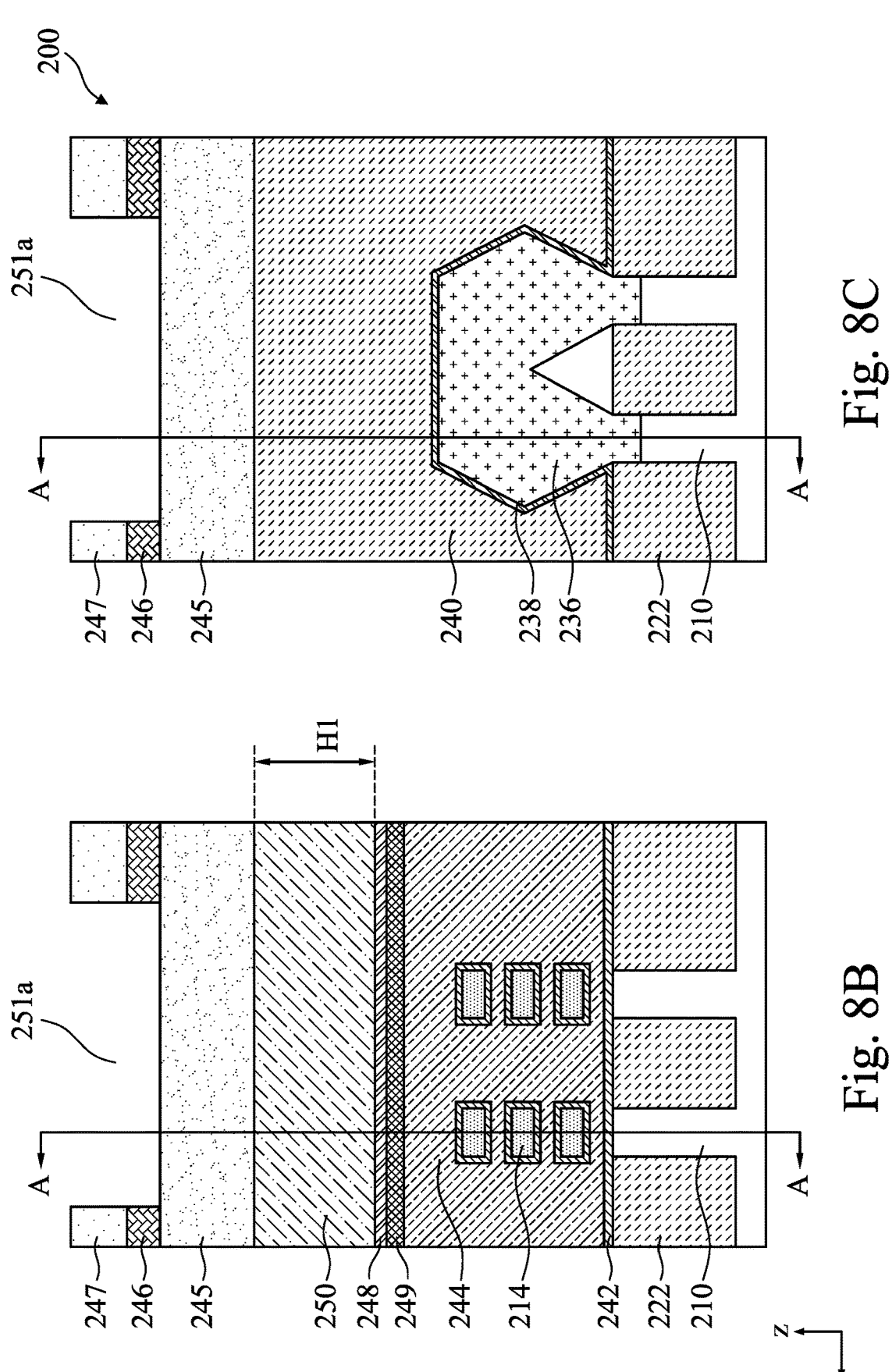
Figure 8D:
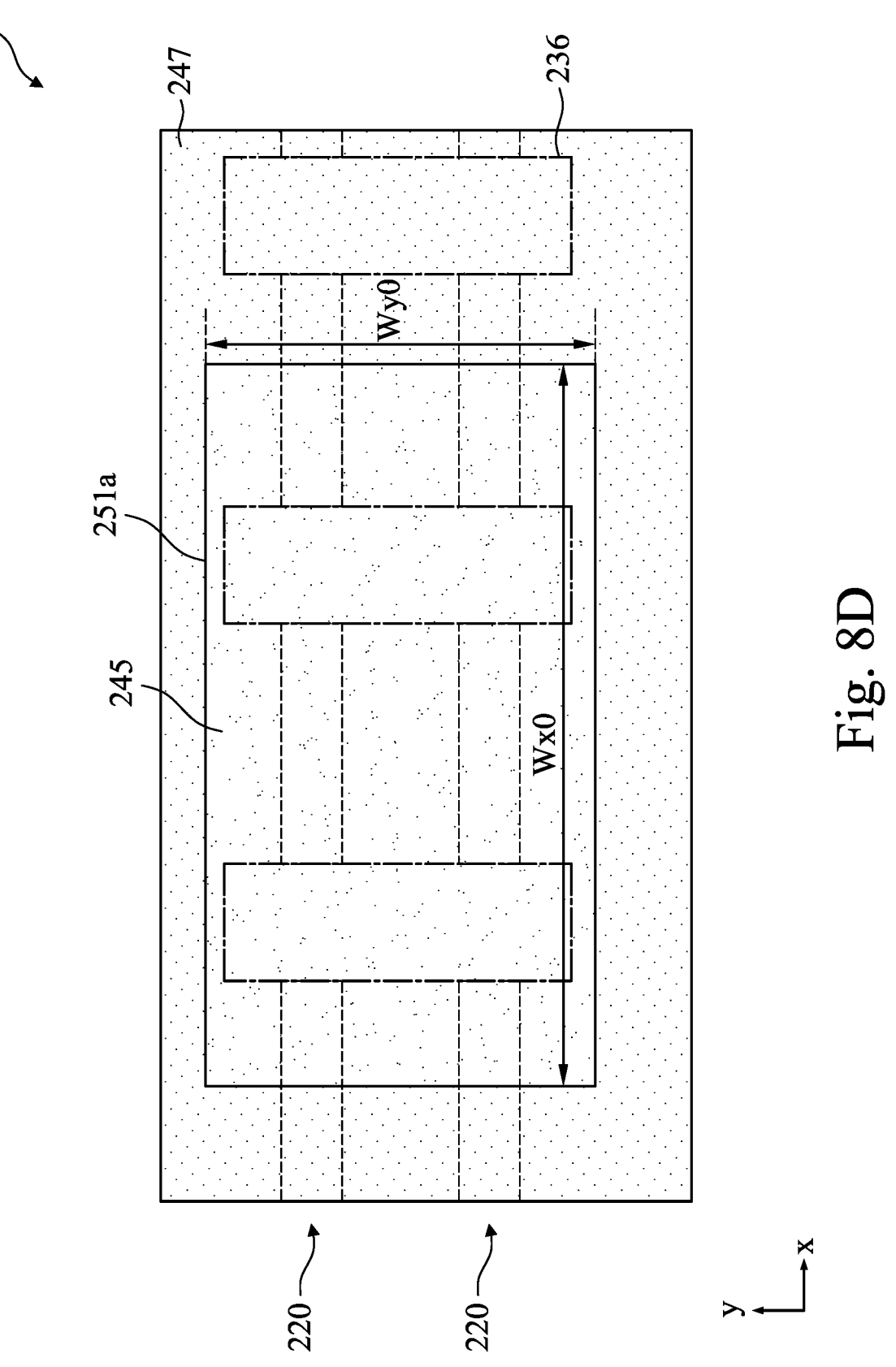

In operation 114, a second ILD layer 245, a mask layer 246, and a cap layer 247 are sequentially deposited over the SAC layer 250 and the ILD layer 240, as shown in FIGS. 8A-8D. FIG. 8A is a schematic cross sectional view of the semiconductor device 200 along A-A line of FIGS. 8B and 8C. FIG. 8B is a schematic cross sectional view of the semiconductor device 200 along B-B line of FIG. 8A. FIG. 8C is a schematic cross sectional view of the semiconductor device 200 along C-C line of FIG. 8A. FIG. 8D is a schematic plan view of the semiconductor device 200.

The second ILD layer 245 may be similar to the ILD layer 240. The second ILD layer 245 is subsequently patterned and function as a mask during formation of source/drain contact openings. In some embodiments, the second ILD layer 245 may include a dielectric material with etch selectively with the ILD layer 240, the SAC layer 250, the CESL 238, and the epitaxial source/drain regions 236. The materials for the ILD layer 245 include compounds comprising Si, O, C, and/or H, such as silicon oxide, SiCOH and SiOC. Organic materials, such as polymers, may be used for the ILD layer 245. In some embodiments, the ILD layer 240 includes silicon oxide. In some embodiments, the second ILD layer 245 may have a thickness in a range between about 20 nm and 50 nm.

The mask layer 246 and cap layer 247 are deposited over the second ILD layer 245 to facilitate patterning and formation of source/drain contact openings through various layers underneath. In some embodiments, the mask layer 246 may be a tungsten carbide (WC) layer. The cap layer 247 may be an oxide layer, such as a silicon oxide layer.

In operation 116, a contact opening 251$a$ is formed in the mask layer 246 and the cap layer 247, as shown in FIGS. 8A-8D. In some embodiments, a photolithography process is performed to form a pattern over the second ILD layer 245 in the mask layer 246 and the cap layer 247. The contact opening 251$a$ is included in the pattern. In some embodiments, the contact opening 251$a$, as shown in FIG. 8D, may be a substantially rectangular shape having a width Wx0 along the x-axis and a width Wy0 along the y-axis. In some embodiments, the width Wx0 may extend across two or more gate structures 233 along the x-axis and the width Wy0 may overlay over the source/drain regions 236 across two or more fin structures 220. In some embodiments, the width Wx0 may be in a range between about 25 nm and 150 nm. The width Wy0 may be in a range between about 65 nm and 120 nm.

The contact opening 251$a$, formed through the mask layer 246 and the cap layer 247, is used as a mask along with the SAC layer 250 in the subsequent processes to form a source/drain contact hole through the second ILD layer 245, the ILD layer 240, portions of the SAC layer 250. In some embodiments, an in-situ atomic layer etching (ALE) process is carried out to form a contact opening to with increased contact area. In some embodiments, the in-situ ALE process includes multiple ALE operations with different processing gases and process parameters. The multiple ALE operations are performed sequentially to form a contact opening with a profile conforming to the top surface 236$t$ and side surfaces 236$s$ of the source/drain region 236.

An ALE operation is capable of a selective surface etch process with high selectivity. In some embodiments, an ALE operation may include an absorption step and a bombardment step. In the absorption step, an etchant, for example, radicals, molecules, or plasma-assisted organic compound, is disposed over a top layer of a surface of a material to be etched. The etchant interacts with surface atoms of the material to be etched. The interaction with the etchant weakens a bonding between the interacted surface atoms and atoms thereunder.

In some embodiments, etchants of ALE operations may include $O_2$, CO, Ar, $H_2$ plasma, or the like. In some other embodiments, etchants of the ALE operations may include Cl-based gas or F-based gas. For example, the Cl-based gas may be $Cl_2$, $BCl_3$, or the like. The F-based gas may be $C_4F_6$, $CF_4$, $C_4F_8$, $CH_3F$, $CH_2F_2$, $CHF_3$, $CF_x$, $NF_3$, or the like. By selecting various etchant or combination of etchants, an ALE operation may be used to selectively etch different materials.

In the bombardment step, a charged ion is then guided toward the etchant and the interacted surface atoms in order to break the weakened bonding between the interacted surface atoms and the underlying atoms of the material to be etched. In some embodiments, ions for the ion bombardment of the ALE operation may include Ar, He, or the like. In some embodiments, the absorption step and the bombardment step are performed in repeated cycles until a predetermined thickness of the material is removed. During an ALE operation, in order to avoid unintentionally damaging unintended material, such as the source/drain regions, the removal of the material to be etched is controlled in a layer-by-layer procedure.

Etching rate and selectivity for each ALE operation may be tuned by adjusting one or more processing parameters, such as etchant composition, etchant concentration, etching time, etching pressure, etching presser source power, RF bias voltage, RF bias power, etchant flow rate, duty cycle of source power and bias power other suitable etching parameters, or combinations thereof. In some embodiments, the ALE process includes sequentially performed ALE operations, as described in operations 118 to 126, each operation tuned to achieve a particular etching selectivity and a particular etching rate. As described below, embodiments of the present disclosure using multiple ALE operations with different plasma collimation (strike mode), reactive gases, and loading effects, to shape a bottom profile of the source/drain contact openings to increase the contact area.

Figure 9A:
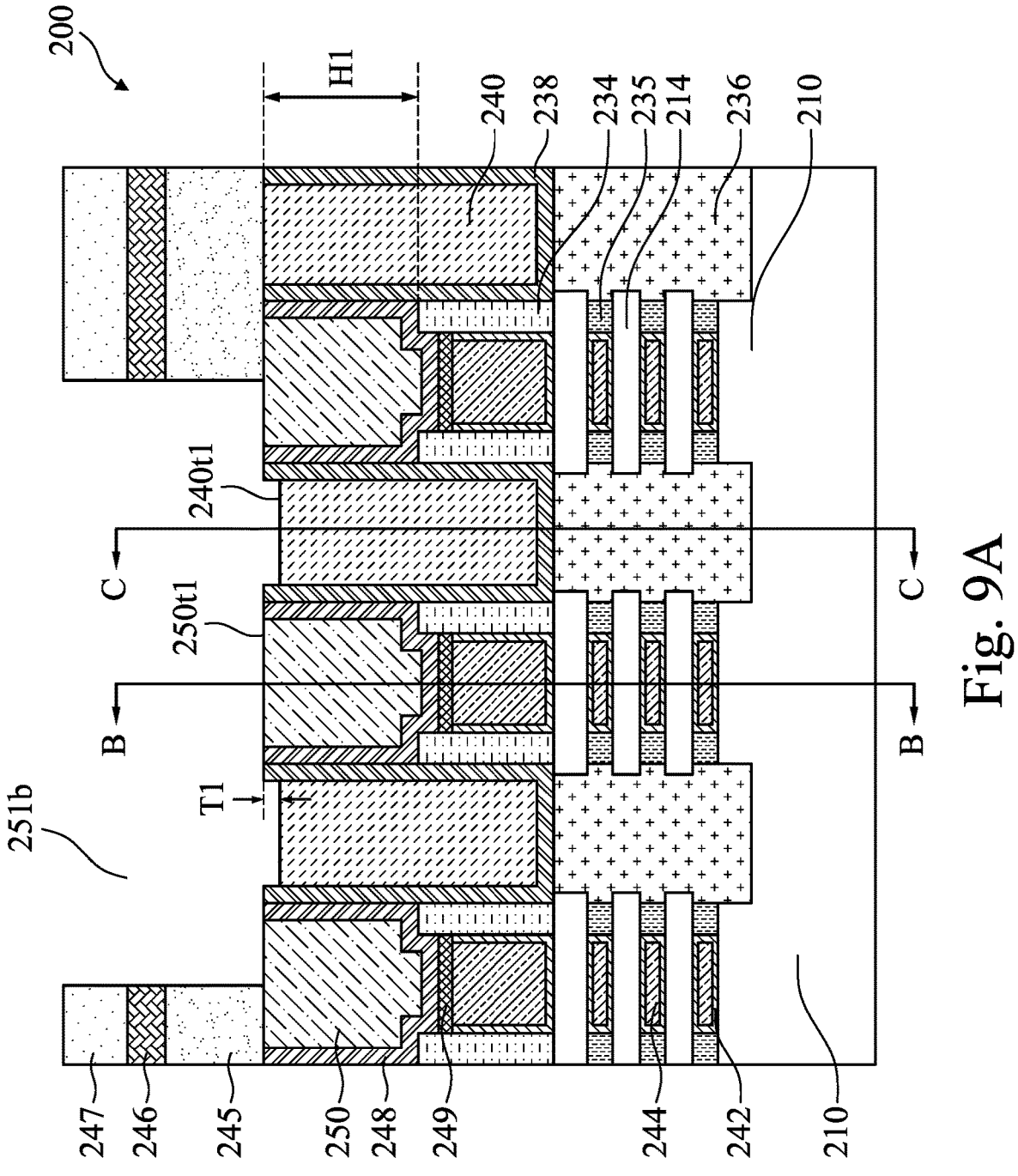
Figures 9B, 9C:
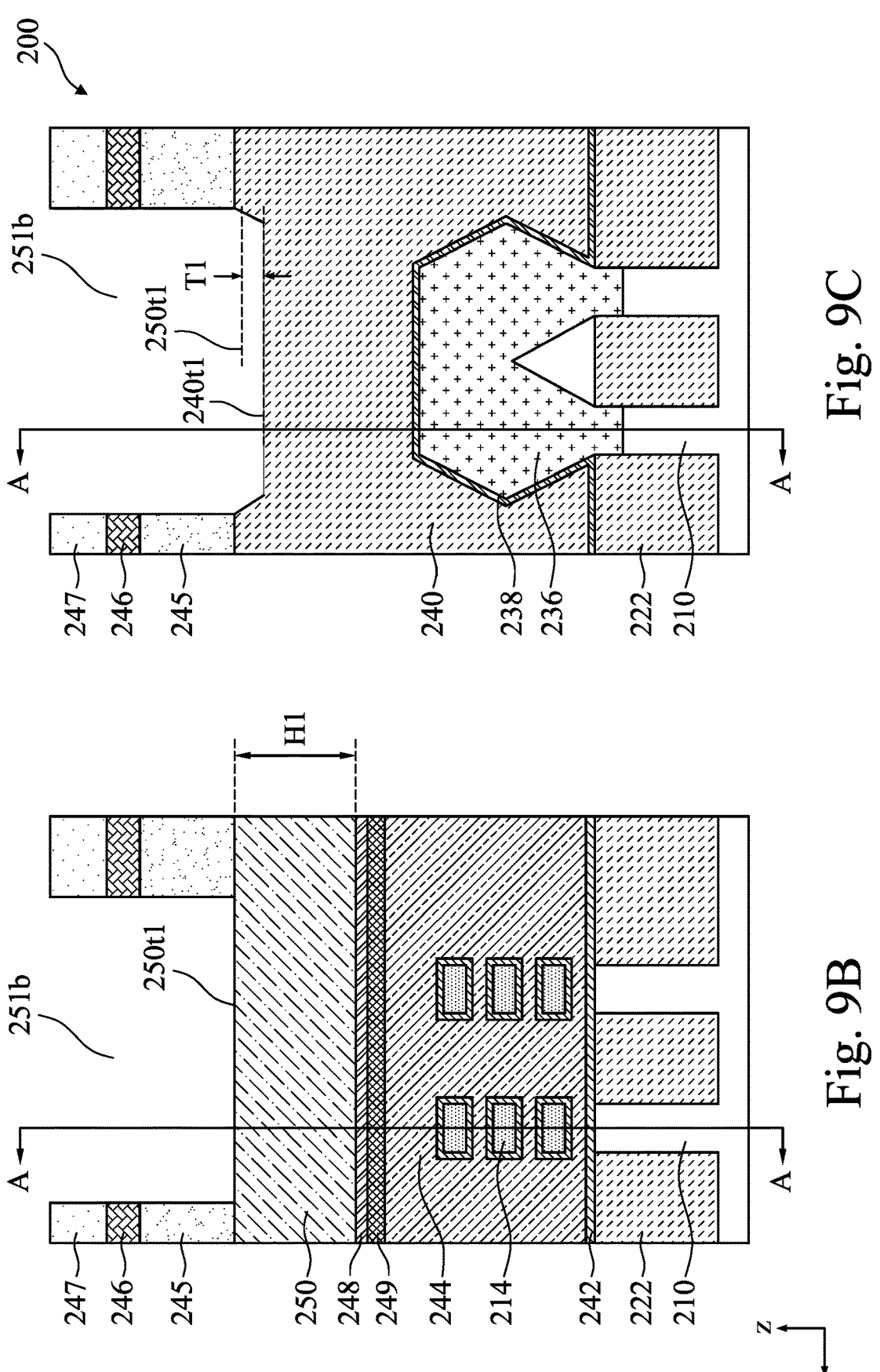
Figure 9D:
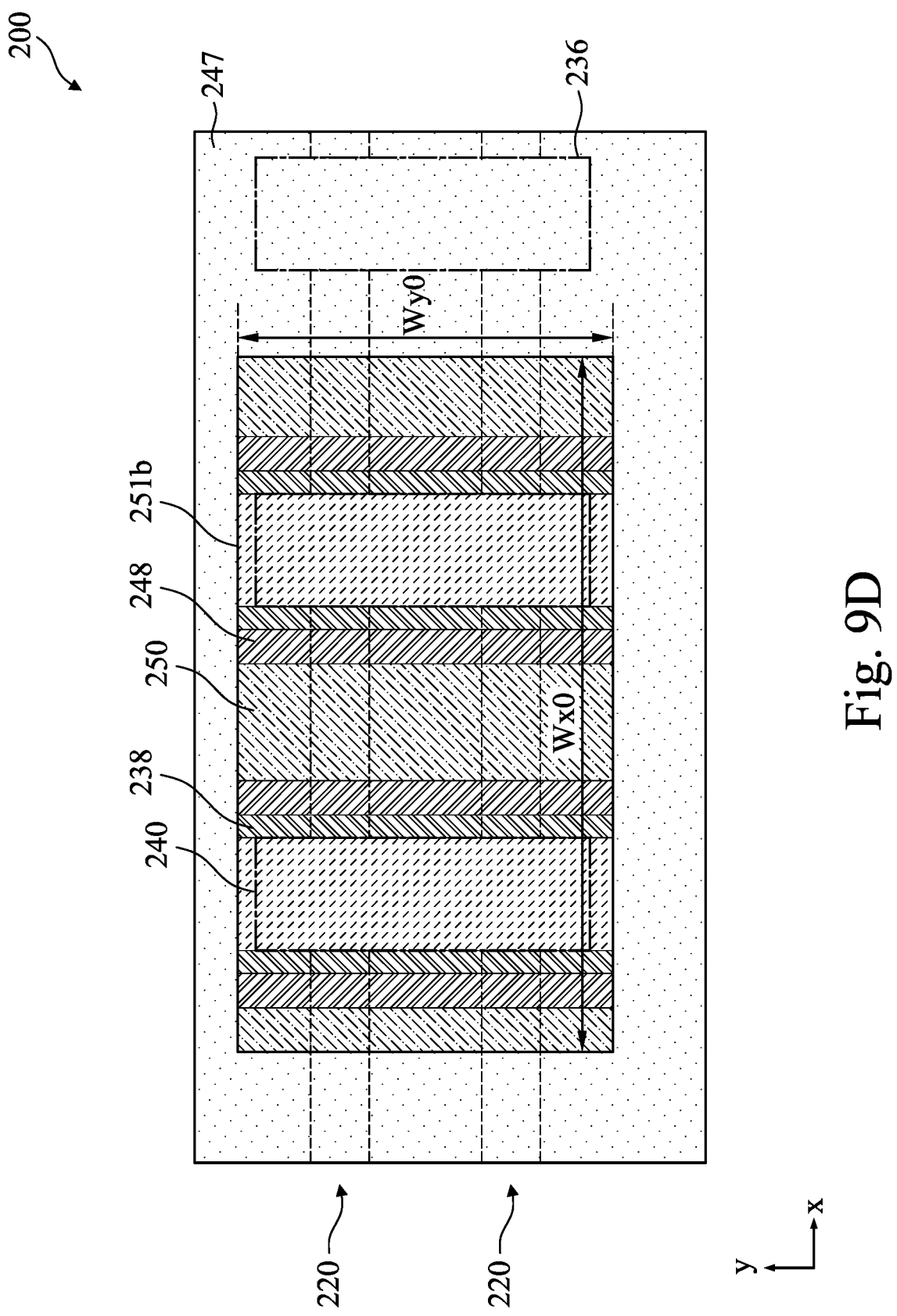

In operation 118, a first ALE operation is performed to remove material exposed by the contact opening 251$a$ to a first depth wherein a top surface 250$t1$ of the SAC layer 250 is exposed, as shown in FIGS. 9A-9D. FIG. 9A is a schematic cross sectional view of the semiconductor device 200 along A-A line of FIGS. 9B and 9C. FIG. 9B is a schematic cross sectional view of the semiconductor device 200 along B-B line of FIG. 9A. FIG. 9C is a schematic cross sectional view of the semiconductor device 200 along C-C line of FIG. 9A. FIG. 9D is a schematic plan view of the semiconductor device 200.

In some embodiments, the first ALE operation is configured to selectively remove the second ILD layer 245 and a portion of the ILD layer 240 exposed by the contact opening 250$a$. The first ALE operation terminates at a top surface 250$t1$ of the SAC layer 250 and a top surface 240$t1$ of the ILD layer 240. In some embodiments, the ILD layer 240 may be etched for a depth T1 measured from the top surface 250$t1$ of the SAC layer 250 to the top surface 240$t1$ of the ILD layer 240. In some embodiments, the depth T1 may be in a range between about 5 nm and about 20 nm. After the first ALE operation, a contact opening 250$b$ is formed. A bottom of the contact opening 250$b$ includes the SAC layer 250, the metal gate liner 248, the CESL layer 238, and the ILD layer 240. In some embodiments, the bottom of the contact opening 250$b$ may be a curved surface having alternative convex profiles over the SAC layer 250 and concave profiles over the ILD layer 240, as shown in FIG. 9A. In some embodiments, the curvature of the convex profile is in a range between about 1.45 and about 1.6. The curvature of the concave profile is in a range between about 0.8 and about 1.5.

The first ALE operation may be performed by two or more cycles. Each cycle may include one or more absorption steps in which an etchant mixture is supplied, and one or more bombardment steps. In some embodiments, the etchant mixture may include oxygen and a F-based gas, and the bombardment gas may include Ar. By way of example and not limitation, each cycle in the first ALE operation may include three steps, which are denoted as steps 1-1, 1-2, and 1-3.

In step 1-1, a gas mixture including $C_4F_6$, $O_2$ and Ar is supplied. The process pressure is in a range between about 5 mTorr and about 15 mTorr. The operation time is between about 1 second and 5 second. A plasma power is applied at a power level in a range between about 20 Watts and about 80 Watts and at a RF frequency in a range between about 1.8 MHz and 2.2 MHz. A bias power is applied at a power level in a range between about 90 Watts to about 300 Watts at a frequency in a range between about 50 MHz and 70 MHz. The plasma power and the bias power may be pulsed at a duty cycle in a range between about 20% and about 40%.

In step 1-2, a gas mixture including Ar is supplied. The process pressure is in a range between about 5 mTorr and about 15 mTorr. The operation time is between about 1 second and 5 second. A plasma power is applied at a power level in a range between about 20 Watts and about 80 Watts and at a RF frequency in a range between about 1.8 MHz and 2.2 MHz. A bias power is applied at a power level in a range between about 90 Watts to about 300 Watts at a frequency in a range between about 50 MHz and 70 MHz. The plasma power and the bias power may be pulsed at a duty cycle in a range between about 20% and about 40%.

In step 1-3, a gas mixture including Ar is supplied. The process pressure is in a range between about 5 mTorr and about 15 mTorr. The operation time is between about 1 second and 3 second. A plasma power is applied at a power level in a range between about 20 Watts and about 80 Watts and at a RF frequency in a range between about 1.8 MHz and 2.2 MHz. A bias power is applied at a power level in a range between about 90 Watts to about 300 Watts at a frequency in a range between about 50 MHz and 70 MHz. The plasma power and the bias power may be pulsed at a duty cycle in a range between about 20% and about 40%.

The first ALE operation may include performing the step 1-1, step 1-2, and step 1-3 in multiple cycles, for example between 2 cycles and 7 cycles to achieve the desired profile as shown in FIG. 9A.

Figure 10A:
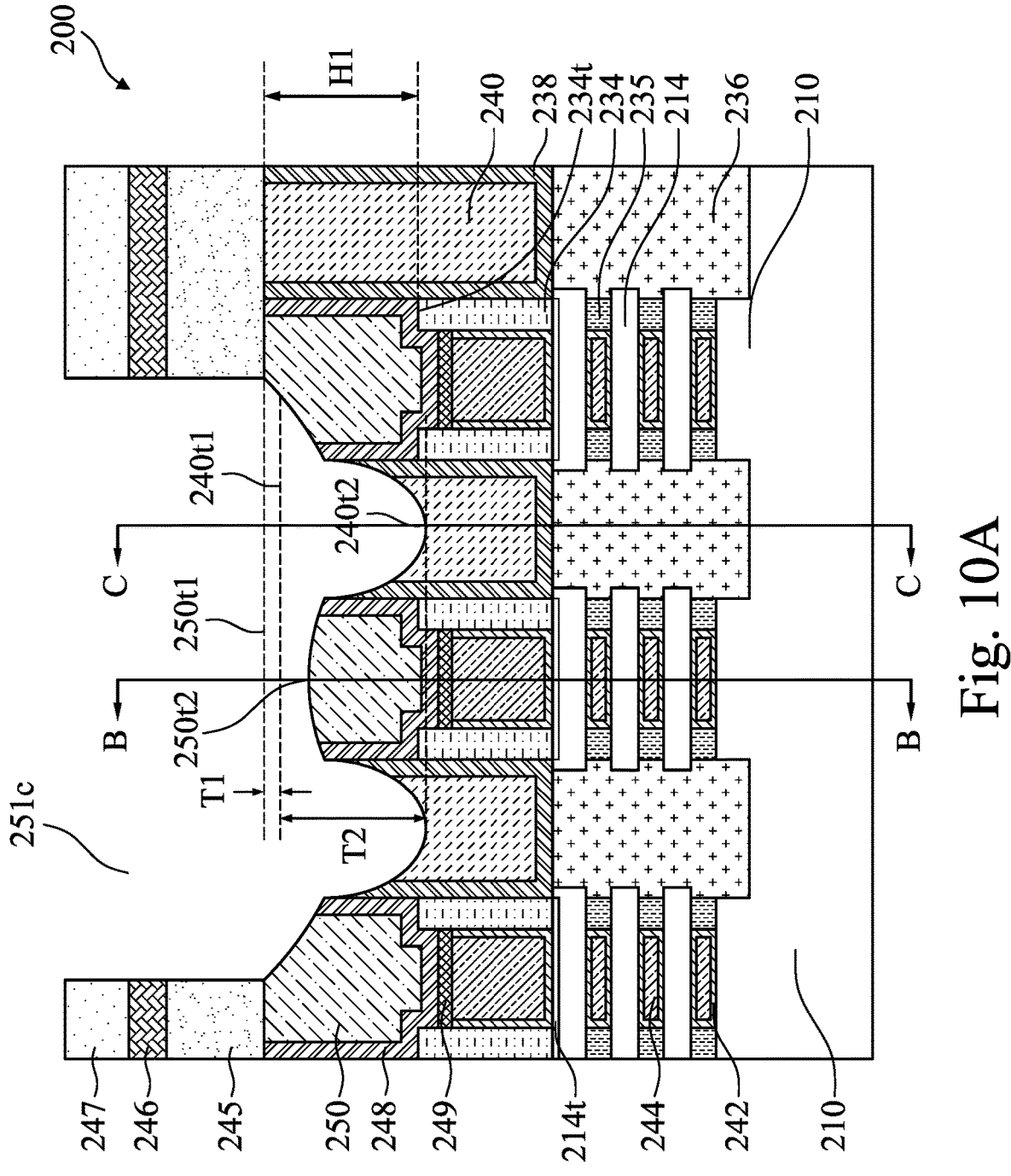
Figures 10B, 10C:
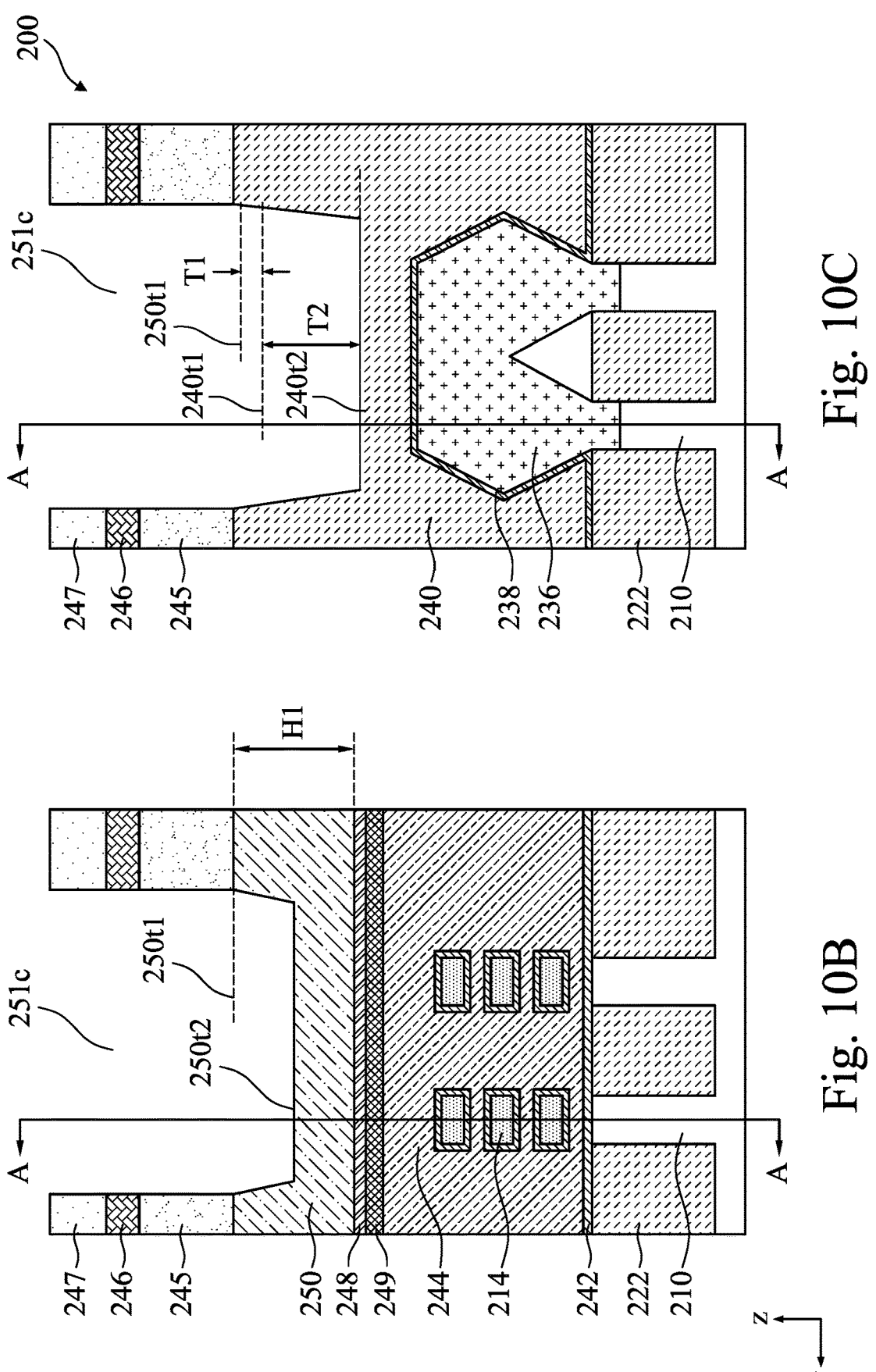
Figure 10D:
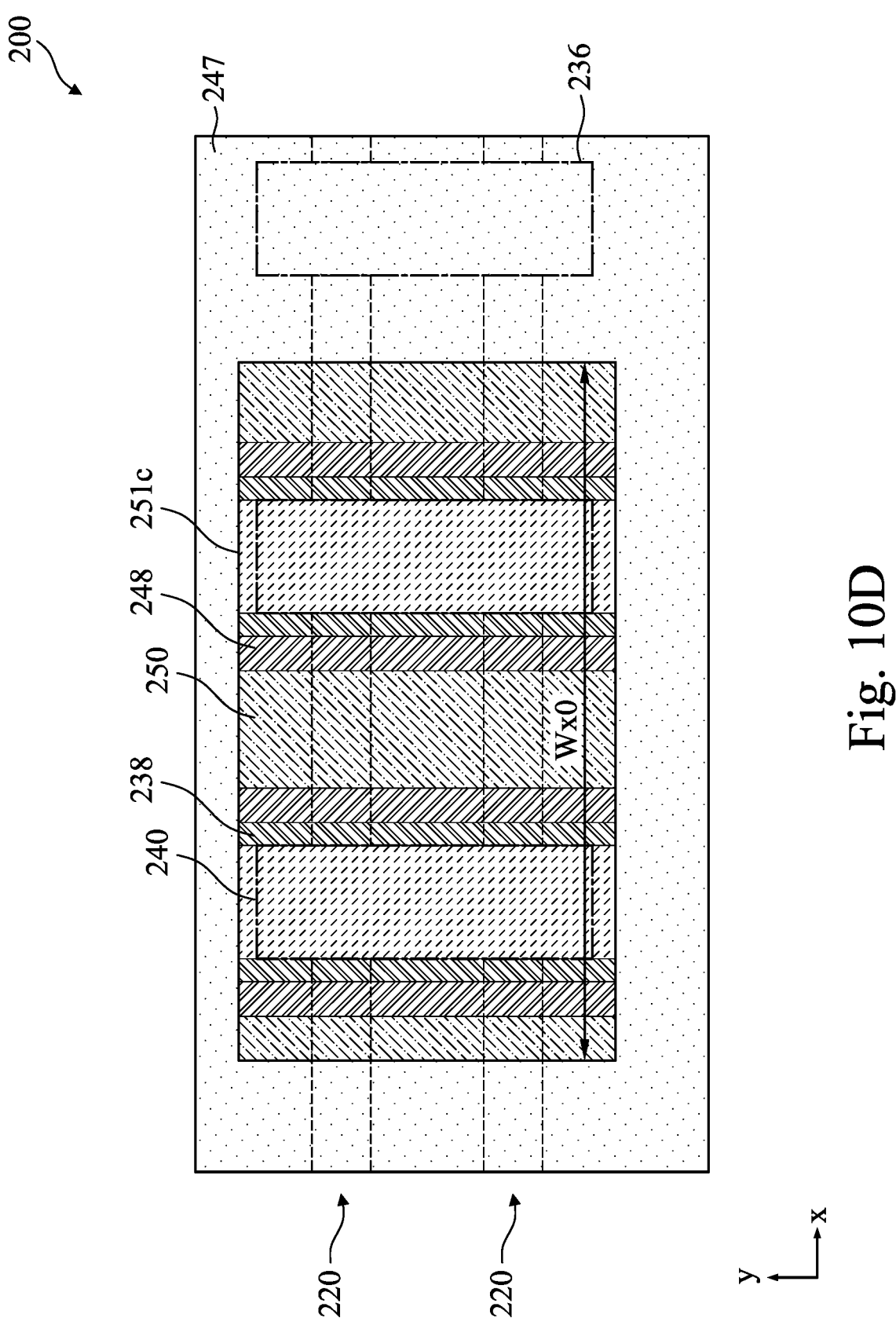

In operation 120, a second ALE operation is performed to remove material exposed by the contact opening 251$b$ to a second depth wherein a top surface 240$t$2 of the ILD layer 240 is at a level near a top surface 234$t$ of the sidewall spacers 234, as shown in FIGS. 10A-10D. FIG. 10A is a schematic cross sectional view of the semiconductor device 200 along A-A line of FIGS. 10B and 10C. FIG. 10B is a schematic cross sectional view of the semiconductor device 200 along B-B line of FIG. 10A. FIG. 10C is a schematic cross sectional view of the semiconductor device 200 along C-C line of FIG. 10A. FIG. 10D is a schematic plan view of the semiconductor device 200.

In some embodiments, the second ALE operation is configured to selectively remove a portion of the ILD layer 240 and a portion of the SAC layer 250 exposed by the contact opening 250$b$. The second ALE operation terminates at a top surface 250$t$2 of the SAC layer 250 and the top surface 240$t$2 of the ILD layer 240. In some embodiments, the top surface 240$t$2 of the ILD layer 240 is near the top surface 234$t$ of the sidewall spacers 234.

In some embodiments, the ILD layer 240 may be etched for a depth T2 measured from the top surface 240$t$1 of the ILD layer 240 after the first ALE operation to the top surface 240$t$2 of the ILD layer 240 after the second ALE operation. In some embodiments, the depth T2 may be in a range between about 20 nm and about 50 nm. After the second ALE operation, a contact opening 250$c$ is formed.

The second ALE operation may be performed by two or more cycles. Each cycle may include one or more absorption steps in which an etchant mixture is supplied, and one or more bombardment steps. In some embodiments, the etchant mixture may include oxygen and a F-based gas, and the bombardment gas may include Ar. By way of example and not limitation, each cycle in the second ALE operation may include three steps, which are denoted as steps 2-1, 2-2, and 2-3.

In step 2-1, a gas mixture including $C_4F_6$, $O_2$, $C_4F_8$, and Ar is supplied. The process pressure is in a range between about 20 mTorr and about 35 mTorr. The operation time is between about 1 second and 4 second. A plasma power is applied at a power level in a range between about 18 Watts and about 150 Watts and at a RF frequency in a range between about 1.8 MHz and 2.2 MHz. A bias power is applied at a power level in a range between about 150 Watts to about 300 Watts at a frequency in a range between about 50 MHz and 70 MHz. The plasma power and the bias power may be pulsed at a duty cycle in a range between about 10% and about 50%.

In step 2-2, a gas mixture including Ar is supplied. The process pressure is in a range between about 5 mTorr and about 40 mTorr. The operation time is between about 1 second and 4 second. A plasma power is applied at a power level in a range between about 18 Watts and about 150 Watts and at a RF frequency in a range between about 1.8 MHz and 2.2 MHz. A bias power is applied at a power level in a range between about 150 Watts to about 300 Watts at a frequency in a range between about 50 MHz and 70 MHz. The plasma power and the bias power may be pulsed at a duty cycle in a range between about 10% and about 50%.

In step 2-3, a gas mixture including Ar is supplied. The process pressure is in a range between about 5 mTorr and about 40 mTorr. The operation time is between about 1 second and 3 second. A plasma power is applied at a power level in a range between about 18 Watts and about 150 Watts and at a RF frequency in a range between about 1.8 MHz and 2.2 MHz. A bias power is applied at a power level in a range between about 150 Watts to about 300 Watts at a frequency in a range between about 50 MHz and 70 MHz. The plasma power and the bias power may be pulsed at a duty cycle in a range between about 10% and about 50%.

The second ALE operation may include performing the step 2-1, step 2-2, and step 2-3 in multiple cycles, for example between 15 cycles and 25 cycles to achieve the desired profile as shown in FIG. 10A.

Figure 11A:
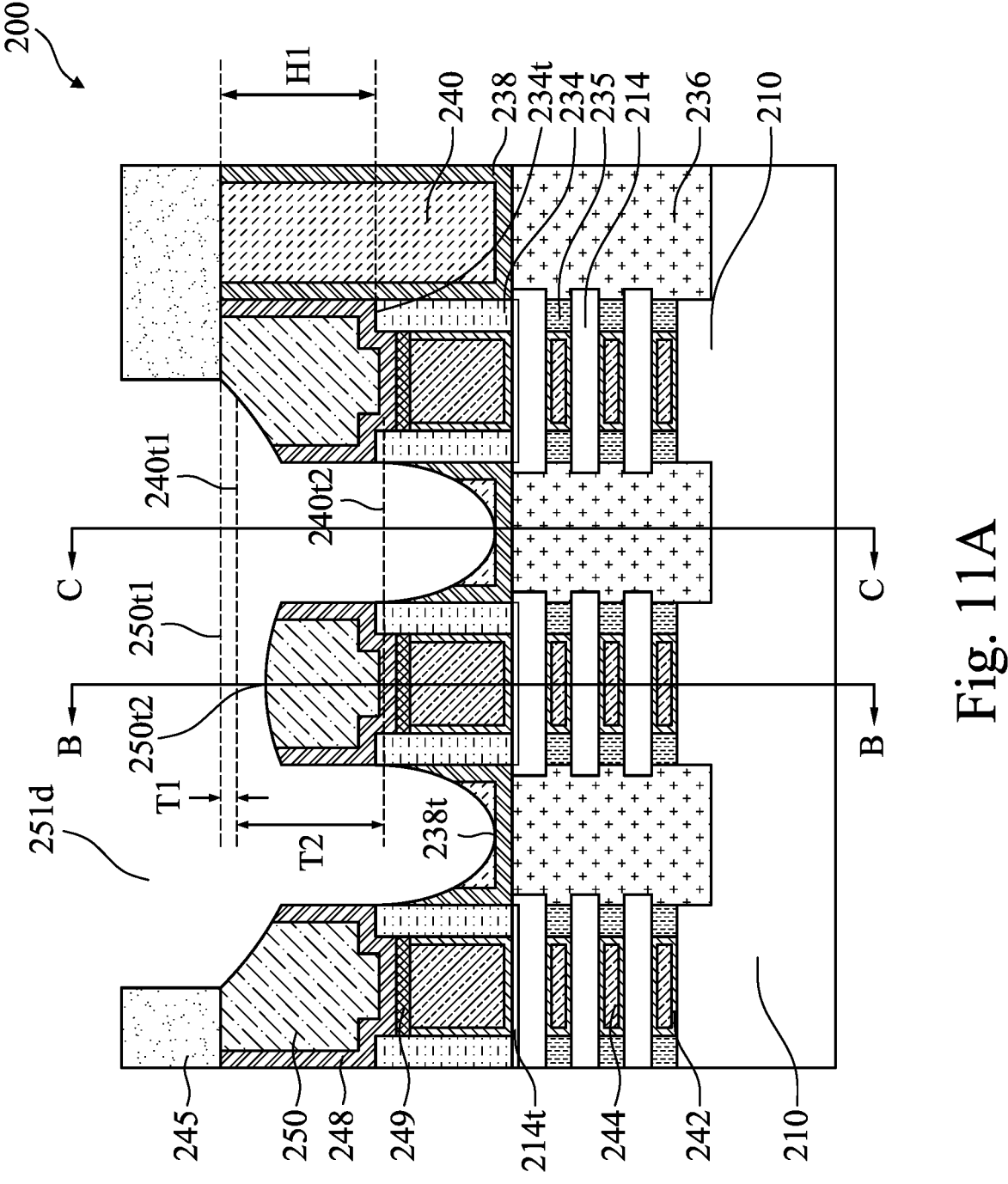
Figures 11B, 11C:
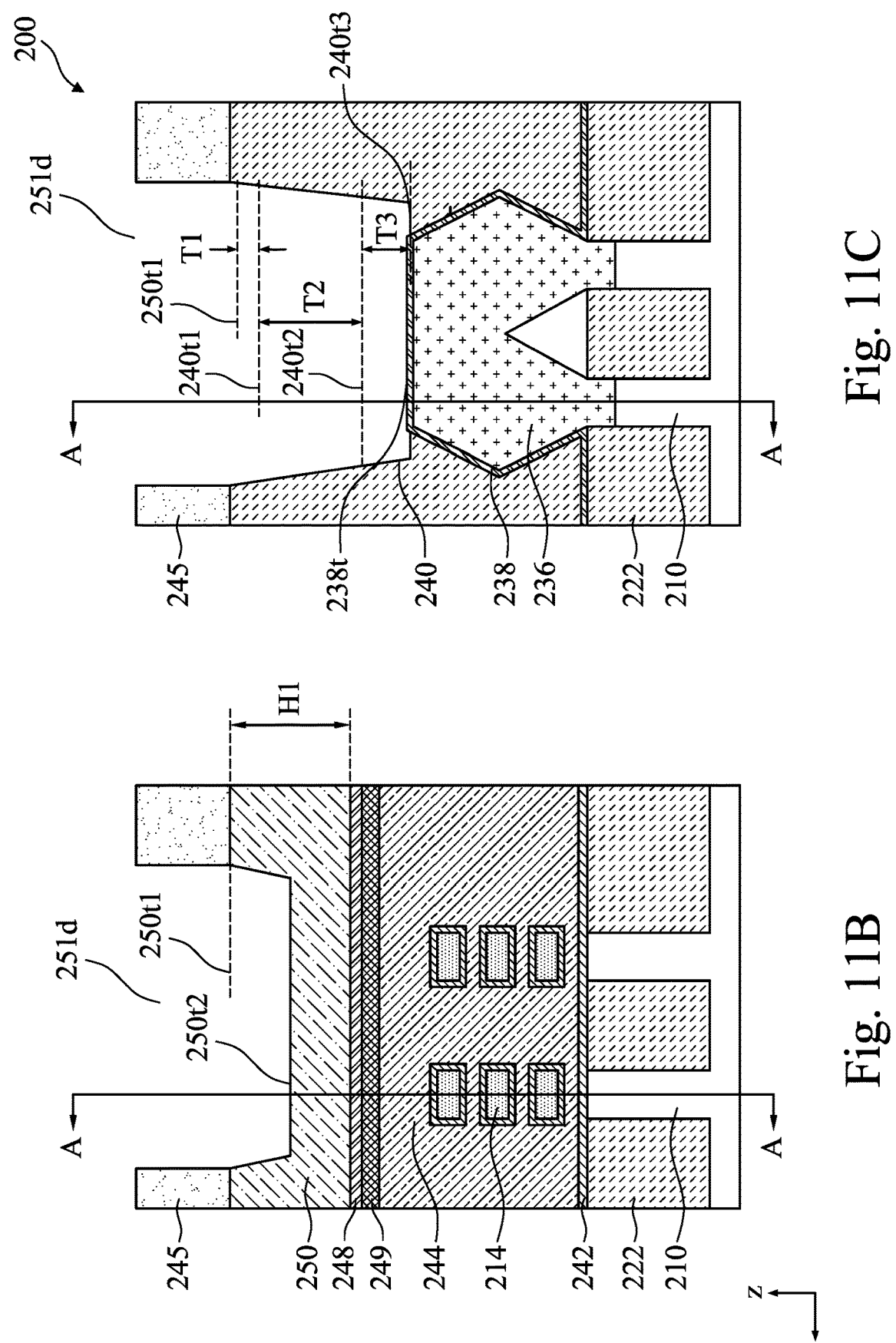
Figure 11D:
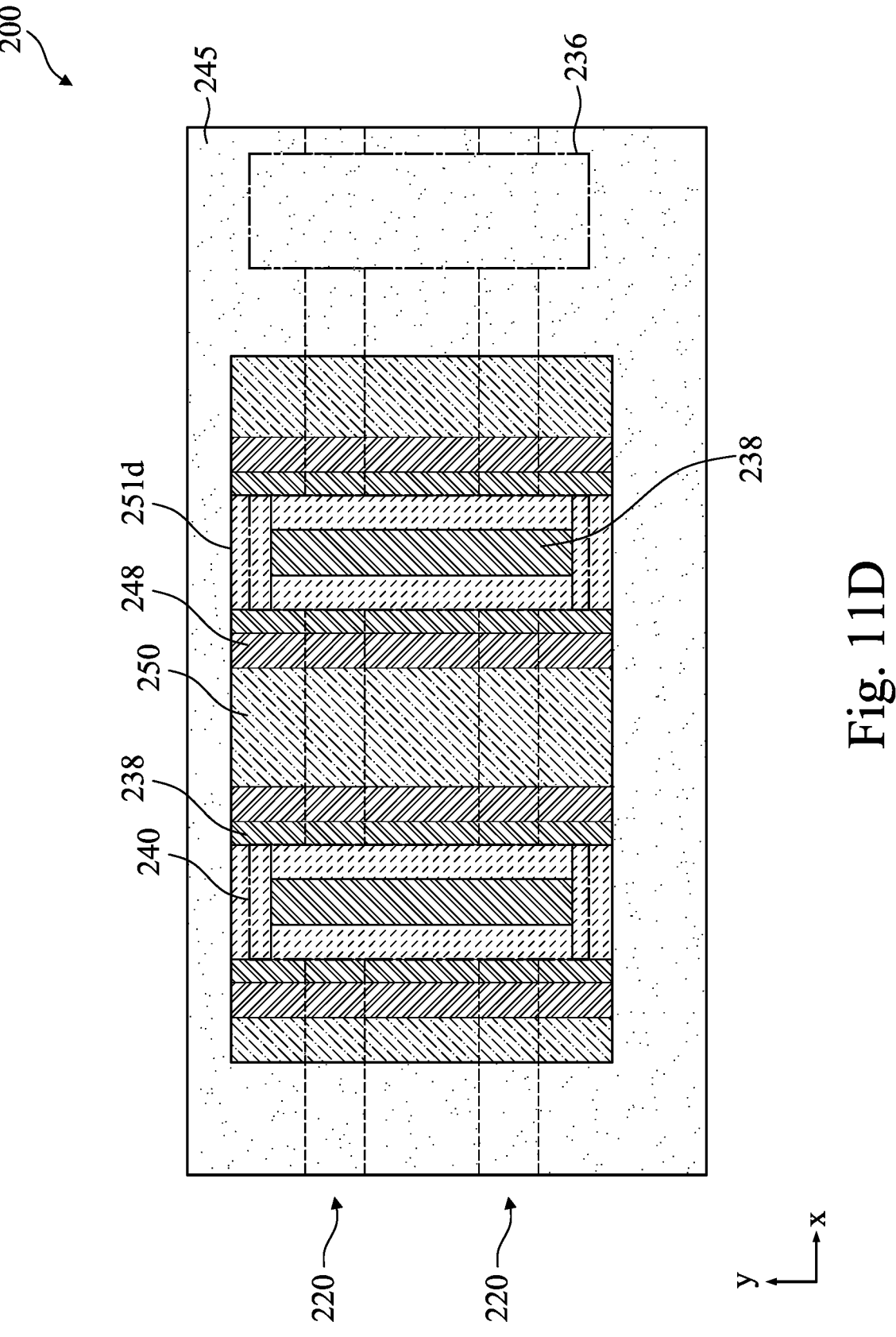

In operation 122, a third ALE operation is performed to remove a portion of the ILD layer 240 material exposed by the contact opening 251$c$ to a third depth that the CESL layer 238 on the top surface 236$t$ of the source/drain region 236 is exposed, as shown in FIGS. 11A-11D. FIG. 11A is a schematic cross sectional view of the semiconductor device 200 along A-A line of FIGS. 11B and 11C. FIG. 11B is a schematic cross sectional view of the semiconductor device 200 along B-B line of FIG. 11A. FIG. 11C is a schematic cross sectional view of the semiconductor device 200 along C-C line of FIG. 11A. FIG. 11D is a schematic plan view of the semiconductor device 200.

In some embodiments, the third ALE operation is configured to selectively remove a portion of the ILD layer 240 exposed by the contact opening 250c. The third ALE operation terminates at a top surface 238t of the portion of the CESL layer 238 the top surface 236t of the source/drain region 236. In some embodiments, the top surface 240t3 of the ILD layer 240 is near or above a top surface 214t of the topmost semiconductor layer 214.

In some embodiments, the ILD layer 240 may be etched for a depth T3 measured from the top surface 240t2 of the ILD layer 240 after the second ALE operation to the top surface 240t3 of the ILD layer 240 after the third ALE operation. In some embodiments, the depth T3 may be in a range between about 20 nm and about 50 nm. After the third ALE operation, a contact opening 250d is formed.

The third ALE operation may be performed by two or more cycles. Each cycle may include one or more absorption steps in which an etchant mixture is supplied, and one or more bombardment steps. In some embodiments, the etchant mixture may include oxygen and a F-based gas, and the bombardment gas may include Ar. By way of example and not limitation, each cycle in the third ALE operation may include three steps, which are denoted as steps 3-1, 3-2, and 3-3.

In step 3-1, a gas mixture including $C_4F_6$, $O_2$, CO, and Ar is supplied. The process pressure is in a range between about 10 mTorr and about 30 mTorr. The operation time is between about 5 second and 10 second. A plasma power is applied at a power level in a range between about 0 Watts and about 70 Watts and at a RF frequency in a range between about 1.8 MHz and 2.2 MHz. A bias power is applied at a power level in a range between about 100 Watts to about 150 Watts at a frequency in a range between about 50 MHz and 70 MHz. The plasma power and the bias power may be supplied continuously.

In step 3-2, a gas mixture including $NF_3$ and Ar is supplied. The process pressure is in a range between about 10 mTorr and about 30 mTorr. The operation time is between about 1 second and 5 second. A plasma power is applied at a power level in a range between about 0 Watts and about 70 Watts and at a RF frequency in a range between about 1.8 MHz and 2.2 MHz. A bias power is applied at a power level in a range between about 100 Watts to about 150 Watts at a frequency in a range between about 50 MHz and 70 MHz. The plasma power and the bias power may be supplied continuously.

In step 3-3, a gas mixture including $NF_3$, $O_2$, and Ar is supplied. The process pressure is in a range between about 10 mTorr and about 30 mTorr. A plasma power is applied at a power level in a range between about 0 Watts and about 70 Watts and at a RF frequency in a range between about 1.8 MHz and 2.2 MHz. A bias power is applied at a power level in a range between about 100 Watts to about 150 Watts at a frequency in a range between about 50 MHz and 70 MHz. The plasma power and the bias power may be supplied continuously.

The third ALE operation may include performing the step 3-1, step 3-2, and step 3-3 in multiple cycles, for example between 5 cycles and 15 cycles to achieve the desired profile as shown in FIG. 11A.

Figure 12A:
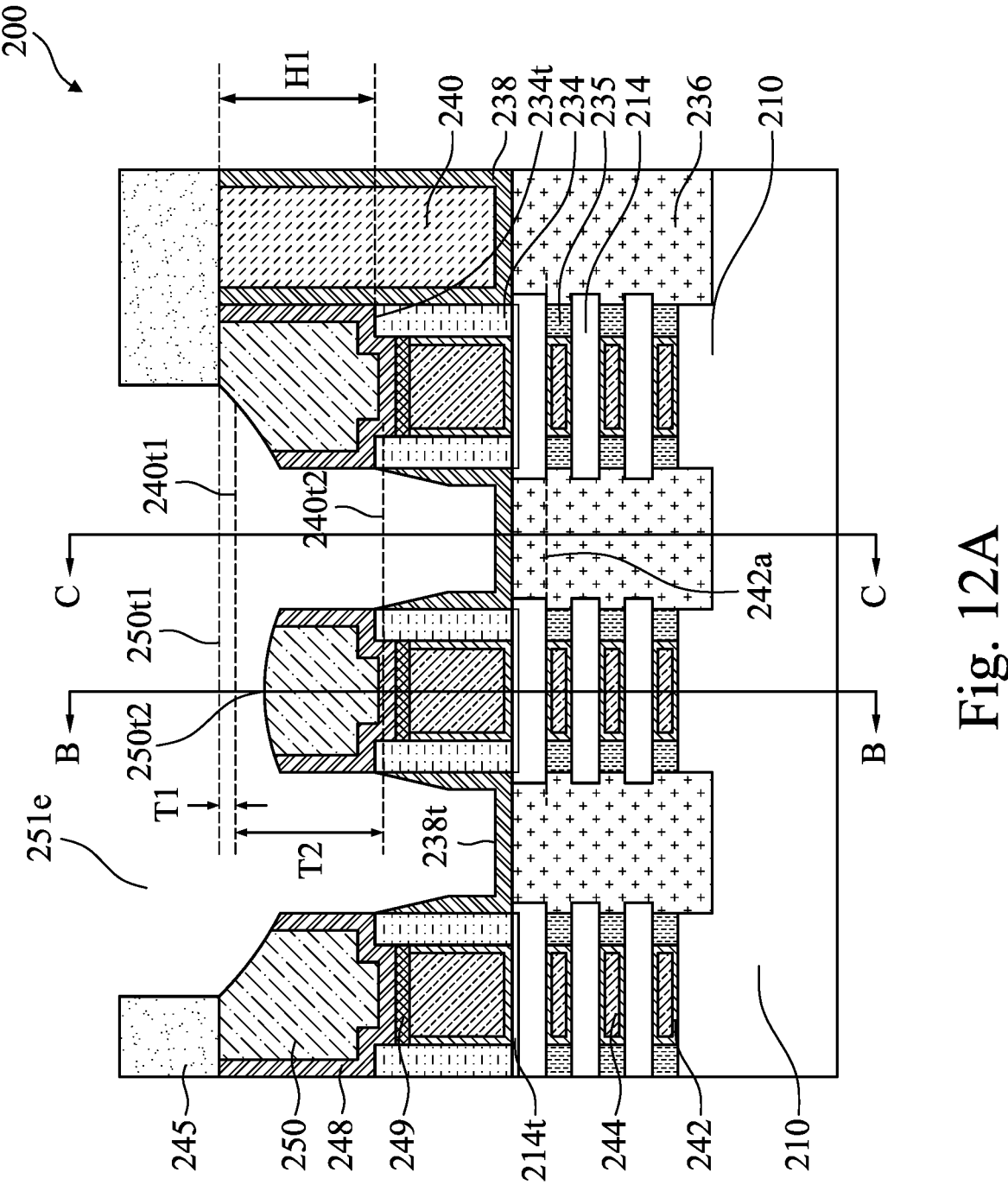
Figures 12B, 12C:
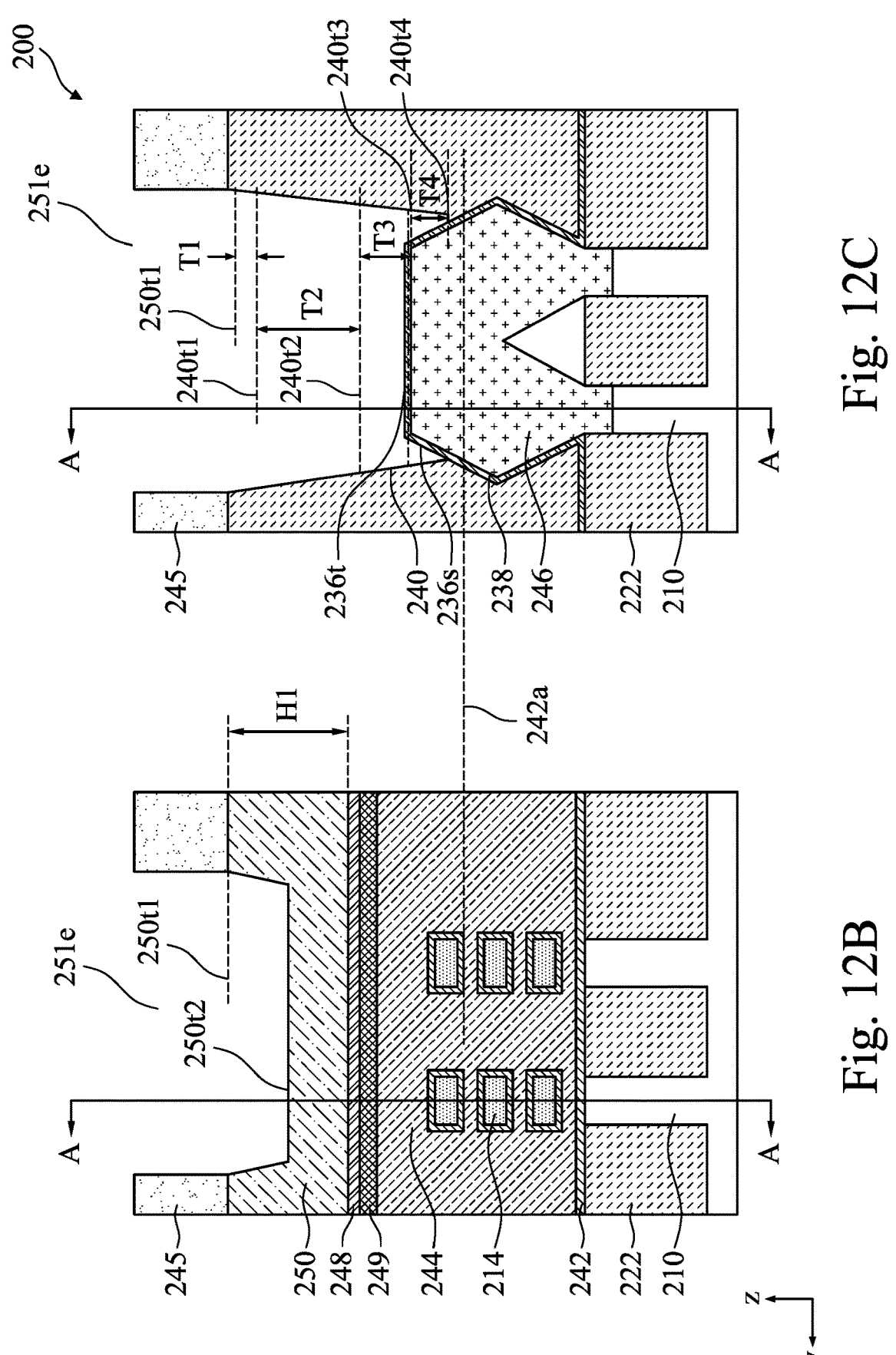
Figure 12D:
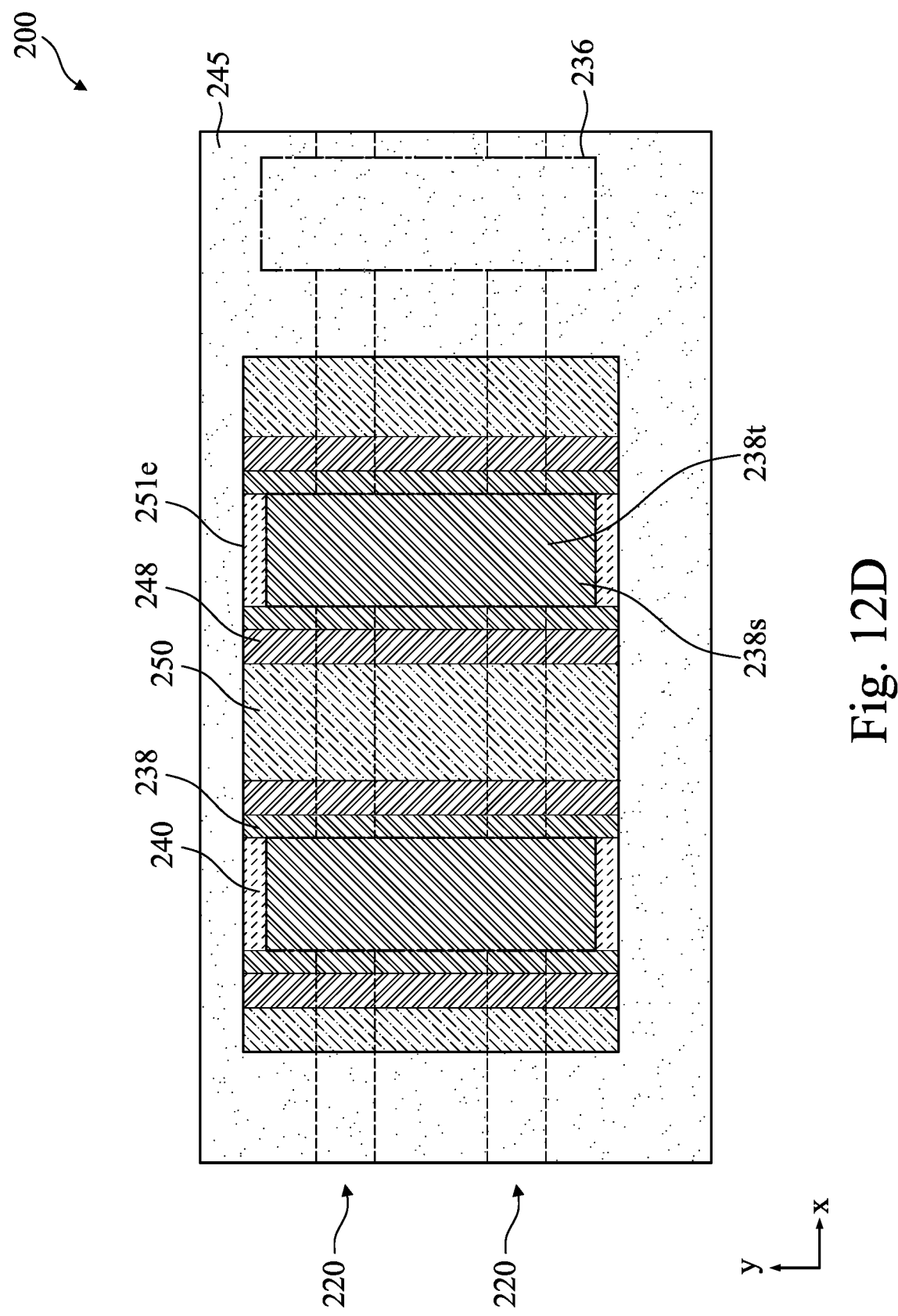

In operation 124, a fourth ALE operation is performed to remove a portion of the ILD layer 240 along the side surfaces 236s of the source/drain regions 236, as shown in FIGS. 12A-12D. FIG. 12A is a schematic cross sectional view of the semiconductor device 200 along A-A line of FIGS. 12B and 12C. FIG. 12B is a schematic cross sectional view of the semiconductor device 200 along B-B line of FIG. 12A. FIG. 12C is a schematic cross sectional view of the semiconductor device 200 along C-C line of FIG. 12A. FIG. 12D is a schematic plan view of the semiconductor device 200.

In some embodiments, the fourth ALE operation is configured to selectively remove a portion of the ILD layer 240 at the bottom of the contact opening 251d. The fourth ALE operation terminates at a top surface 240t4 of the ILD layer 240. The top surface 240t4 of the ILD layer 240 is below the top surface 236t of the source/drain region 236 and is in contact with the CESL layer 238 form on the side surface 236s of the source/drain region 236.

In some embodiments, the ILD layer 240 may be etched for a depth T4 measured from the top surface 240t3 of the ILD layer 240 after the third ALE operation to the top surface 240t4 of the ILD layer 240 after the fourth ALE operation. In some embodiments, the depth T4 may be in a range between about 1 nm and about 5 nm. After the second ALE operation, a contact opening 250e is formed. In some embodiments, the fourth ALE operation terminates when the top surface 240t4 remains above the gate dielectric layer 242a at a lower surface of the topmost semiconductor layer 214 (the topmost channel region). By keeping the top surface 240t4 above the gate dielectric layer 242a, the bottom profile of the contact opening 251e can stay above the widest portion of the source/drain region 236.

In some embodiments, the fourth ALE operation ensures that a sufficient thickness of the CESL layer 238 remains on top of the source/drain regions 236. In some embodiments, the CESL layer 238 has a thickness in a range between about 5 nm and about 10 nm to provide sufficient protection to the source/drain regions 236.

By way of example and not limitation, each cycle in the fourth ALE operation may include six steps, which are denoted as steps 4-1, 4-2, 4-3, 4-4, 4-5, and 4-6.

In step 4-1, a gas mixture including $C_4F_6$, $O_2$, and Ar is supplied. The process pressure is in a range between about 20 mTorr and about 50 mTorr. The operation time is between about 1 second and 5 second. A plasma power is applied at a power level in a range between about 60 Watts and about 350 Watts and at a RF frequency in a range between about 22 MHz and 32 MHz. A bias power is applied at a power level in a range between about 0 Watts to about 100 Watts at a frequency in a range between about 50 MHz and 70 MHz. The plasma power and the bias power may be pulsed at a duty cycle in a range between about 20% and about 50%.

In step 4-2, a gas mixture including Ar is supplied. The process pressure is in a range between about 20 mTorr and about 40 mTorr. The operation time is between about 1 second and 4 second. A plasma power is applied at a power level in a range between about 60 Watts and about 350 Watts and at a RF frequency in a range between about 22 MHz and 32 MHz. A bias power is applied at a power level in a range between about 0 Watts to about 100 Watts at a frequency in a range between about 50 MHz and 70 MHz. The plasma power and the bias power may be pulsed at a duty cycle in a range between about 20% and about 50%.

In step 4-3, a gas mixture including Ar is supplied. The process pressure is in a range between about 20 mTorr and about 40 mTorr. The operation time is between about 1 second and 3 second. A plasma power is applied at a power level in a range between about 60 Watts and about 350 Watts and at a RF frequency in a range between about 22 MHz and 32 MHz. A bias power is applied at a power level in a range between about 0 Watts to about 100 Watts at a frequency in a range between about 50 MHz and 70 MHz. The plasma power and the bias power may be pulsed at a duty cycle in a range between about 20% and about 50%.

In step 4-4, a gas mixture including $C_4F_6$, $O_2$, CO, and Ar is supplied. The process pressure is in a range between about 20 mTorr and about 40 mTorr. The operation time is between about 1 second and 5 second. A plasma power is applied at a power level in a range between about 60 Watts and about 350 Watts and at a RF frequency in a range between about 22 MHz and 32 MHz. A bias power is applied at a power level in a range between about 0 Watts to about 100 Watts at a frequency in a range between about 50 MHz and 70 MHz. The plasma power and the bias power may be pulsed at a duty cycle in a range between about 20% and about 50%.

In step 4-5, a gas mixture including Ar is supplied. The process pressure is in a range between about 20 mTorr and about 40 mTorr. The operation time is between about 1 second and 3 second. A plasma power is applied at a power level in a range between about 60 Watts and about 350 Watts and at a RF frequency in a range between about 22 MHz and 32 MHz. A bias power is applied at a power level in a range between about 0 Watts to about 100 Watts at a frequency in a range between about 50 MHz and 70 MHz. The plasma power and the bias power may be pulsed at a duty cycle in a range between about 20% and about 50%.

In step 4-6, a gas mixture including Ar is supplied. The operation time is between about 1 second and 4 second. The process pressure is in a range between about 20 mTorr and about 40 mTorr. A plasma power is applied at a power level in a range between about 60 Watts and about 350 Watts and at a RF frequency in a range between about 22 MHz and 32 MHz. A bias power is applied at a power level in a range between about 0 Watts to about 100 Watts at a frequency in a range between about 50 MHz and 70 MHz. The plasma power and the bias power may be pulsed at a duty cycle in a range between about 20% and about 50%.

The fourth ALE operation may include performing the step 4-1, step 4-2, and step 4-3 in multiple cycles, for example between 5 cycles and 10 cycles, and then performing the step 4-4, step 4-5, and step 4-6 in multiple cycles, for example between 10 cycles and 20 cycles, to achieve the desired profile as shown in FIG. 12A.

Figure 13A:
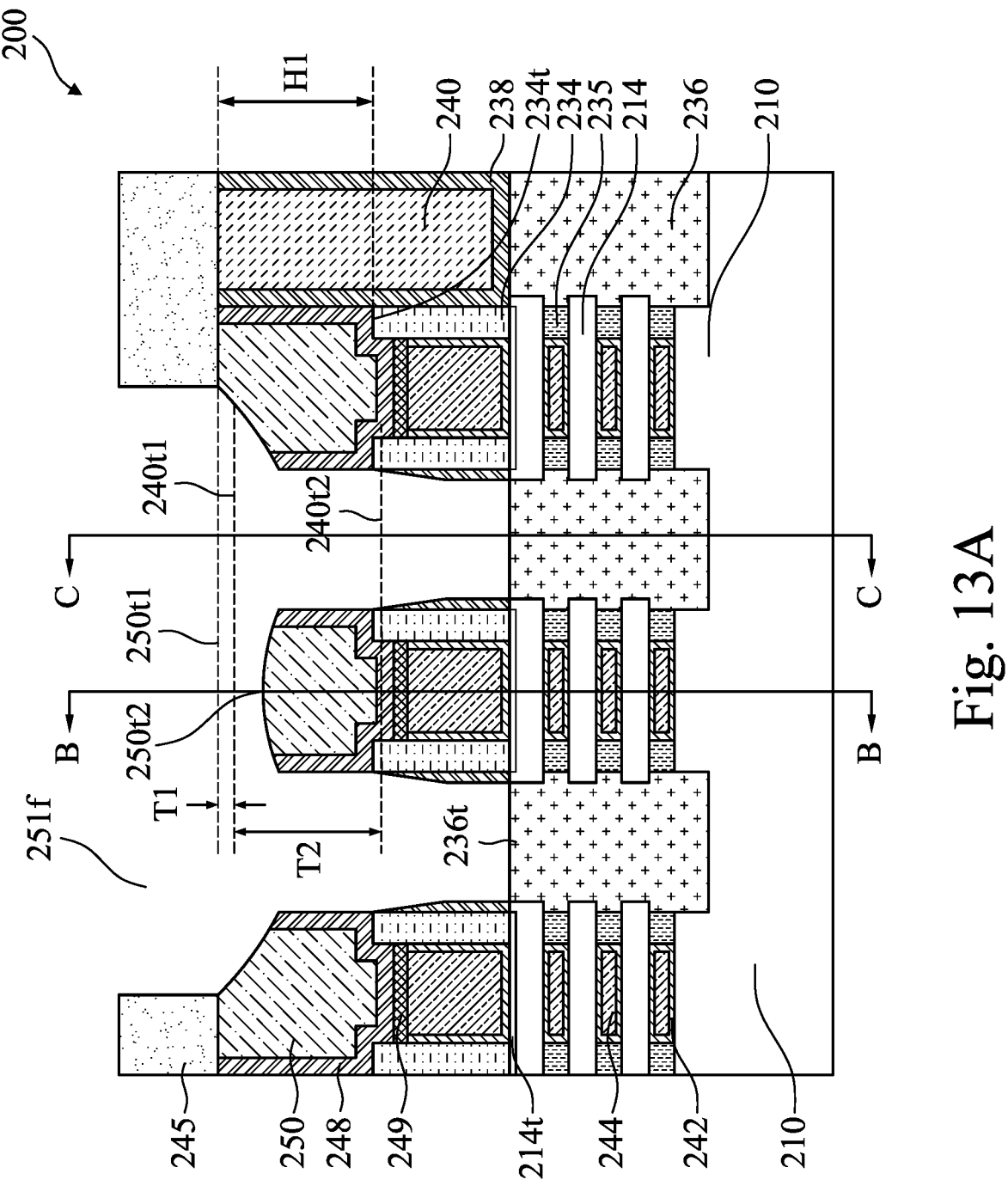
Figures 13B, 13C:
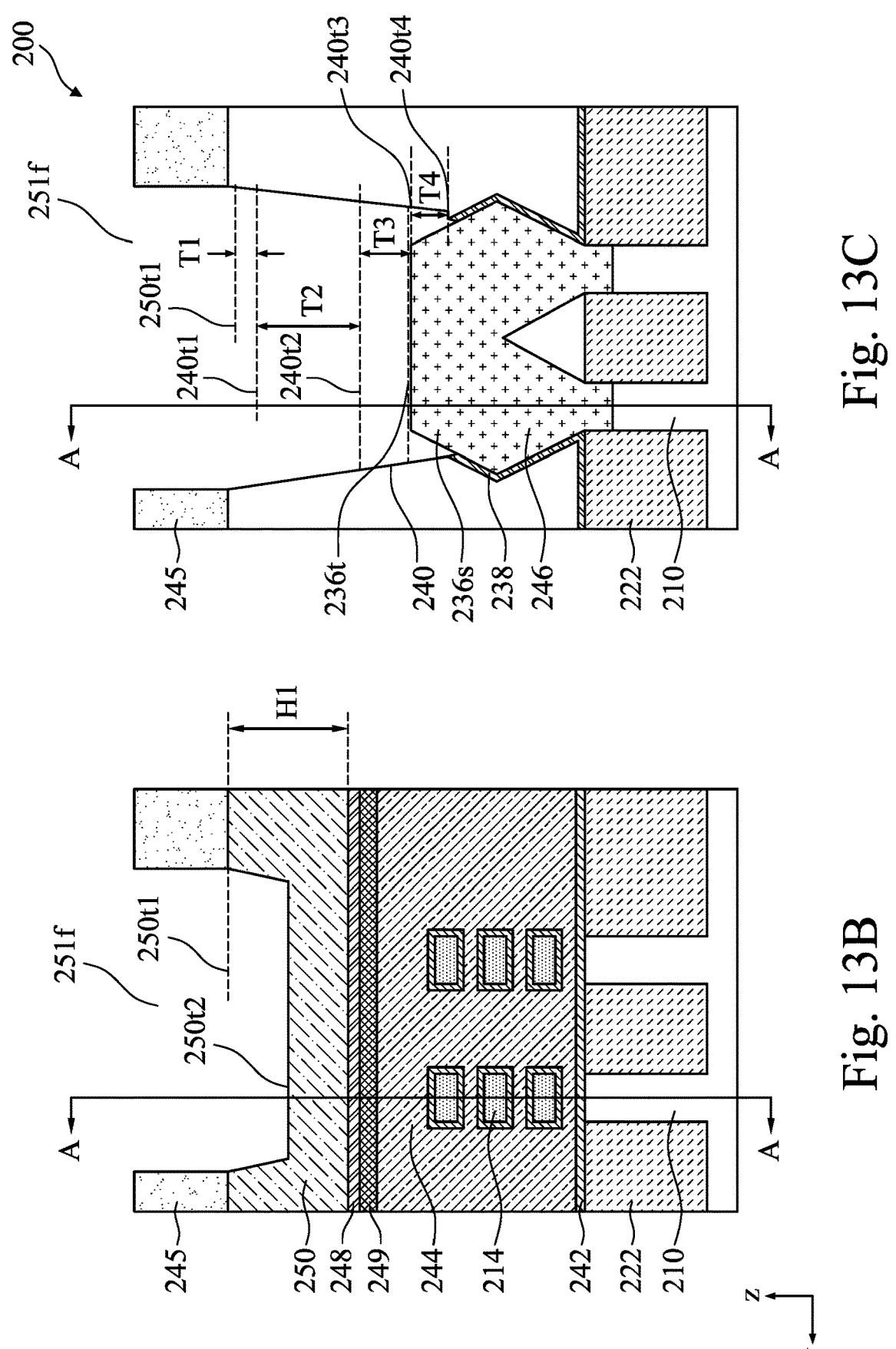
Figure 13D:
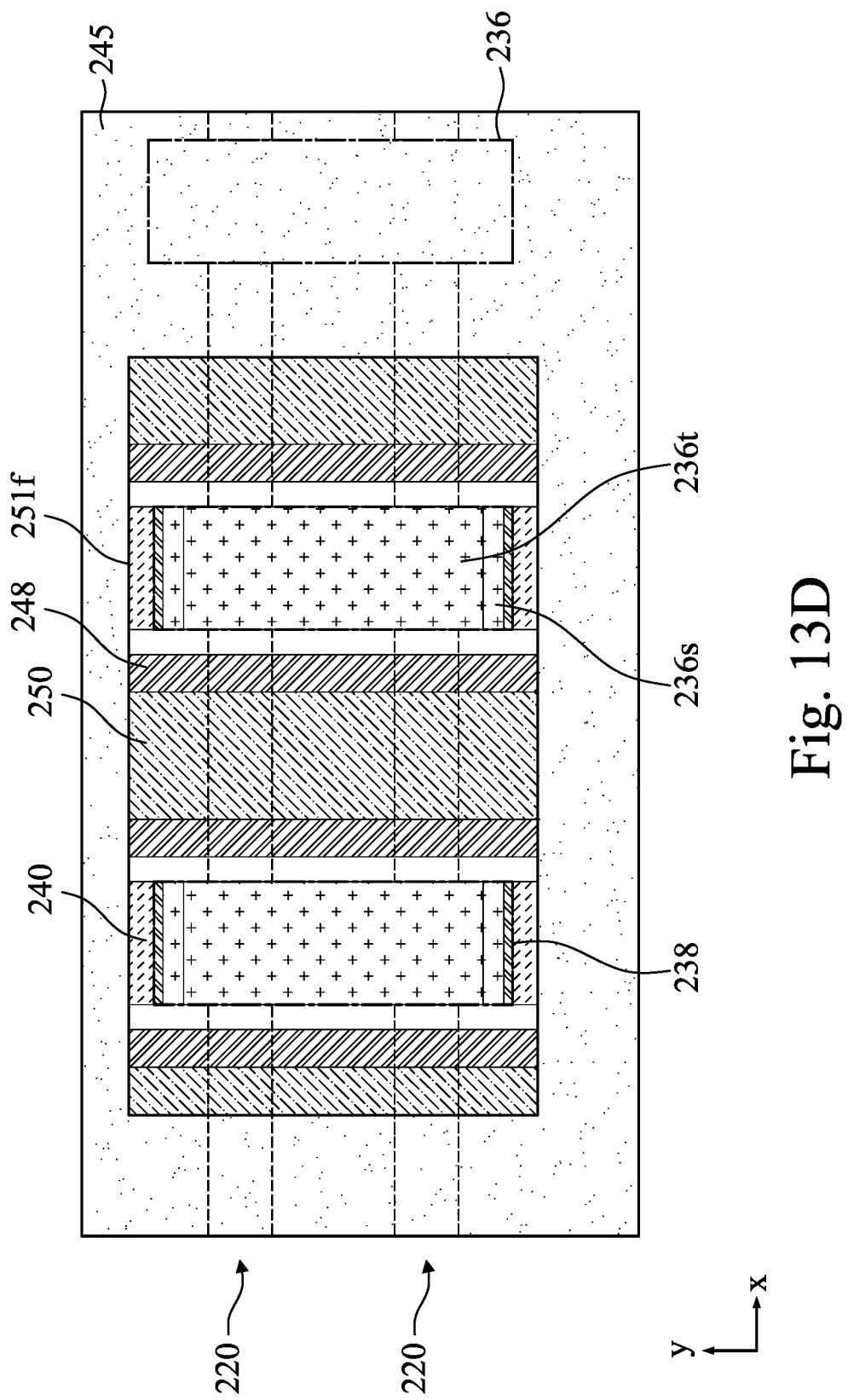

In operation 126, a fifth ALE operation is performed to remove a portion of the CESL layer 238 exposed by the contact opening 251 so that the top surface 236t and portions of the side surfaces 236s of the source/drain region 236 are exposed, as shown in FIGS. 13A-13D. FIG. 13A is a schematic cross sectional view of the semiconductor device 200 along A-A line of FIGS. 13B and 13C. FIG. 13B is a schematic cross sectional view of the semiconductor device 200 along B-B line of FIG. 13A. FIG. 13C is a schematic cross sectional view of the semiconductor device 200 along C-C line of FIG. 13A. FIG. 13D is a schematic plan view of the semiconductor device 200.

In some embodiments, the fifth ALE operation is configured to selectively remove the CESL layer 238. The fifth ALE operation terminates when the CESL layer 238 is removed from the bottom of the contact openings 251e so that the top surface 236t and side surfaces 236s of the source/drain region 236 are exposed. After the fifth ALE operation, a contact opening 250f is formed and ready for formation of source/drain contact features therein.

The fifth ALE operation may be performed by two or more cycles. Each cycle may include one or more absorption steps in which an etchant mixture is supplied, and one or more bombardment steps. By way of example and not limitation, each cycle in the fifth ALE operation may include four steps, which are denoted as steps 5-1, 5-2, 5-3, and 5-4.

In step 5-1, a gas mixture including $C_4F_6$, $O_2$, CO, and Ar is supplied. The process pressure is in a range between about 10 mTorr and about 30 mTorr. The operation time is between about 5 second and 10 second. A plasma power is applied at a power level in a range between about 0 Watts and about 100 Watts and at a RF frequency in a range between about 1.8 MHz and 2.2 MHz. A bias power is applied at a power level in a range between about 100 Watts to about 350 Watts at a frequency in a range between about 50 MHz and 70 MHz. The plasma power and the bias power may be supplied continuously.

In step 5-2, a gas mixture including $NF_3$ and Ar is supplied. The process pressure is in a range between about 10 mTorr and about 30 mTorr. The operation time is between about 1 second and 5 second. A plasma power is applied at a power level in a range between about 0 Watts and about 100 Watts and at a RF frequency in a range between about 1.8 MHz and 2.2 MHz. A bias power is applied at a power level in a range between about 100 Watts to about 350 Watts at a frequency in a range between about 50 MHz and 70 MHz. The plasma power and the bias power may be supplied continuously.

In step 5-3, a gas mixture including $NF_3$, $O_2$, and Ar is supplied. The process pressure is in a range between about 10 mTorr and about 30 mTorr. The operation time is between about 3 second and 5 second. A plasma power is applied at a power level in a range between about 0 Watts and about 100 Watts and at a RF frequency in a range between about 1.8 MHz and 2.2 MHz. A bias power is applied at a power level in a range between about 100 Watts to about 350 Watts at a frequency in a range between about 50 MHz and 70 MHz. The plasma power and the bias power may be supplied continuously.

In step 5-4, a gas mixture including $CH_3F$, $H_2$, and Ar is supplied. The process pressure is in a range between about 10 mTorr and about 30 mTorr. The operation time is between about 10 second and 20 second. A plasma power is applied at a power level in a range between about 0 Watts and about 100 Watts and at a RF frequency in a range between about 1.8 MHz and 2.2 MHz. A bias power is applied at a power level in a range between about 100 Watts to about 350 Watts at a frequency in a range between about 50 MHz and 70 MHz. The plasma power and the bias power may be supplied continuously.

The fifth ALE operation may include performing the step 5-1, step 5-2, 5-3, and step 5-4 in multiple cycles, for example between 2 cycles and 6 cycles to remove the CESL layer 238 and expose the source/drain regions 236.

As shown in FIG. 13C, the top surface 236t and the side surfaces 236s of the source/drain region 236 encompass the bottom profile of the contact opening 251f. Because the side surfaces 236s are sloped, the bottom profile of the contact opening 251f is non-linear, thus, creating an increased surface area with respect to the dimension of the contact opening 251f. The increased surface area is particularly beneficial when the contact opening 251f includes bottom vias with high aspect ratio.

This non-linear bottom profile is achieve using a high selective ALE process, which is carried out for in-situ cycle-by-cycle etch back process in an atomic scale. By controlling process parameters, such as tuning plasma collimation and selecting reactive gases in multiple ALE operations, the ALE process according to the present disclosure effectively forms an opening near facets of the epitaxial source/drain regions 236, resulting in increased contact area and reduced contact resistance.

Figure 13E:

FIG. 13E schematically illustrates the sequential changes of bottom profiles of the contact opening 251 in the x-z plane according to embodiments of the present disclosure. In FIG. 13, curves 251*b*1, 251*b*2, 251*b*3, and 251*b*4 schematically illustrate the bottom profiles of the contact opening 251 after operations 118, 120, 122, and 124 respectively.

Figure 14A:
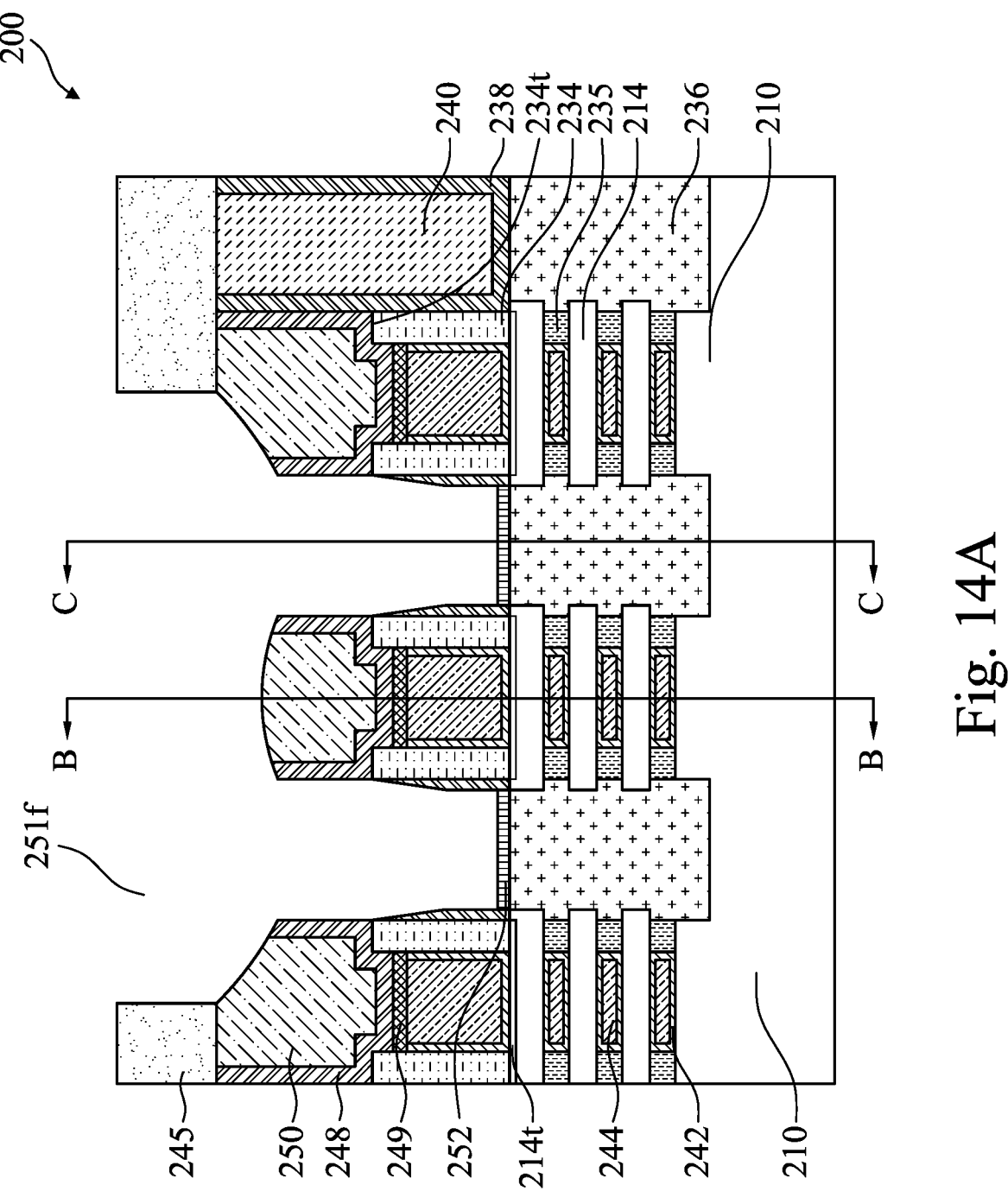
Figure 14C:
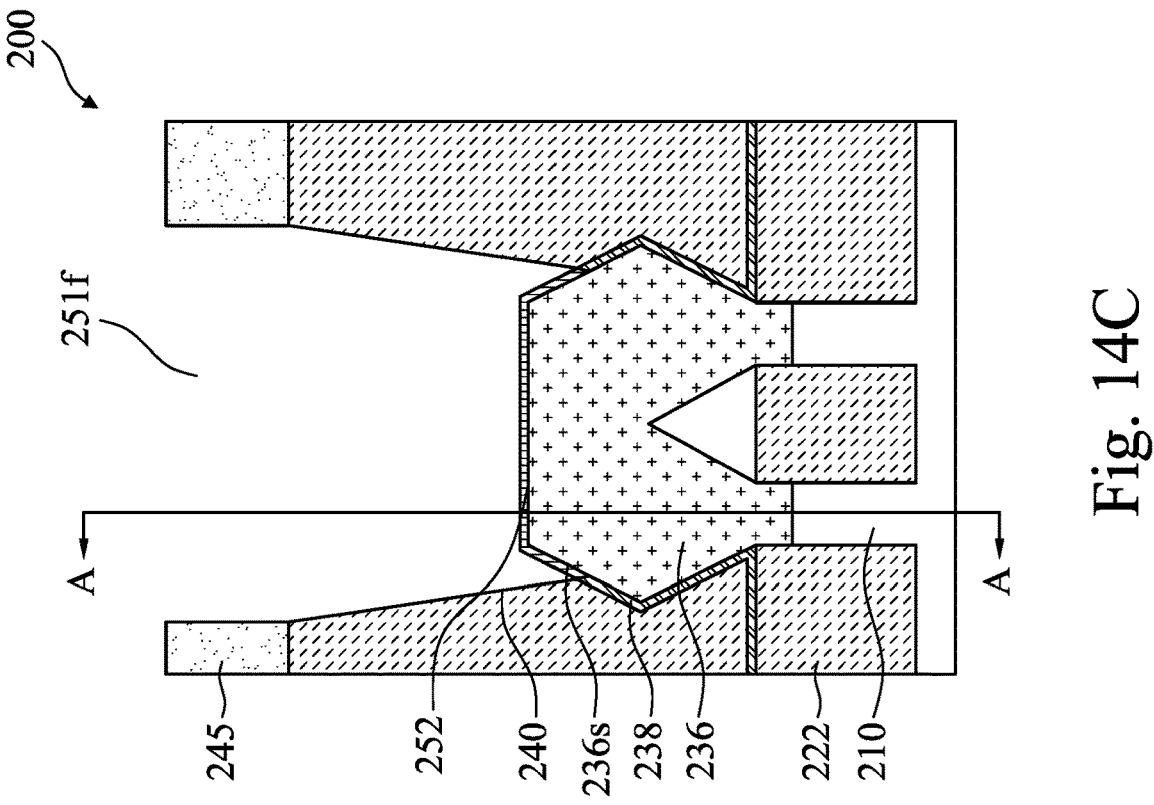
Figure 14B:
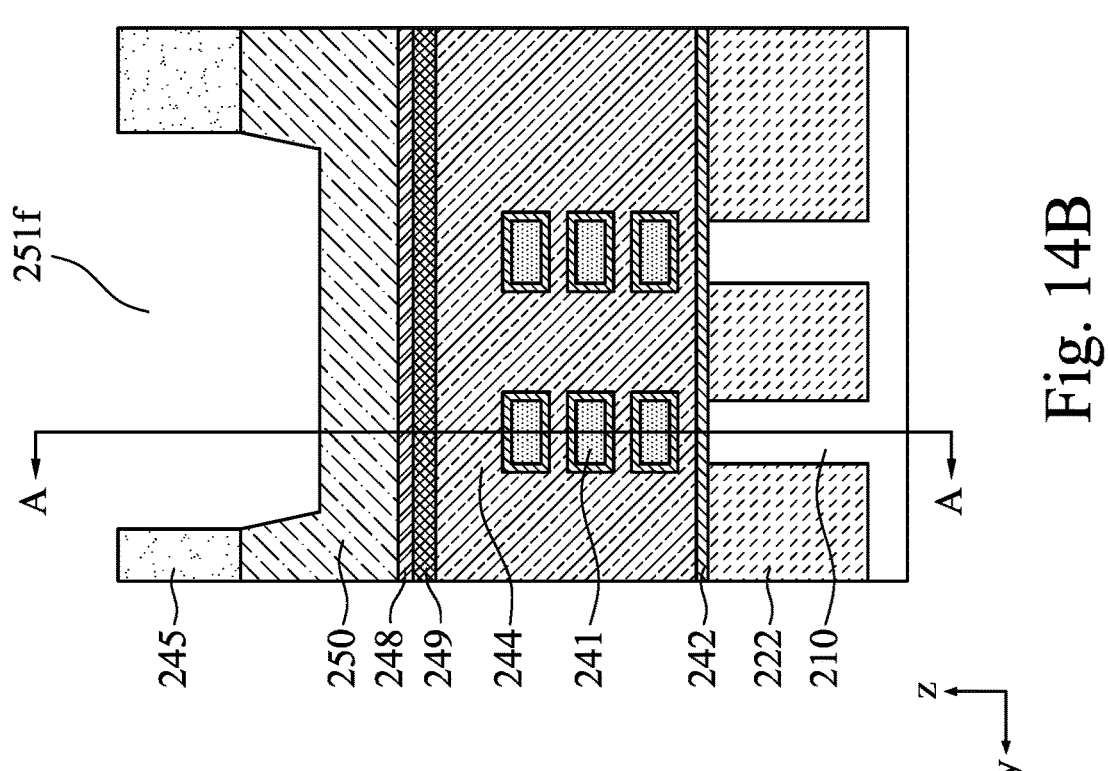
Figure 14D:
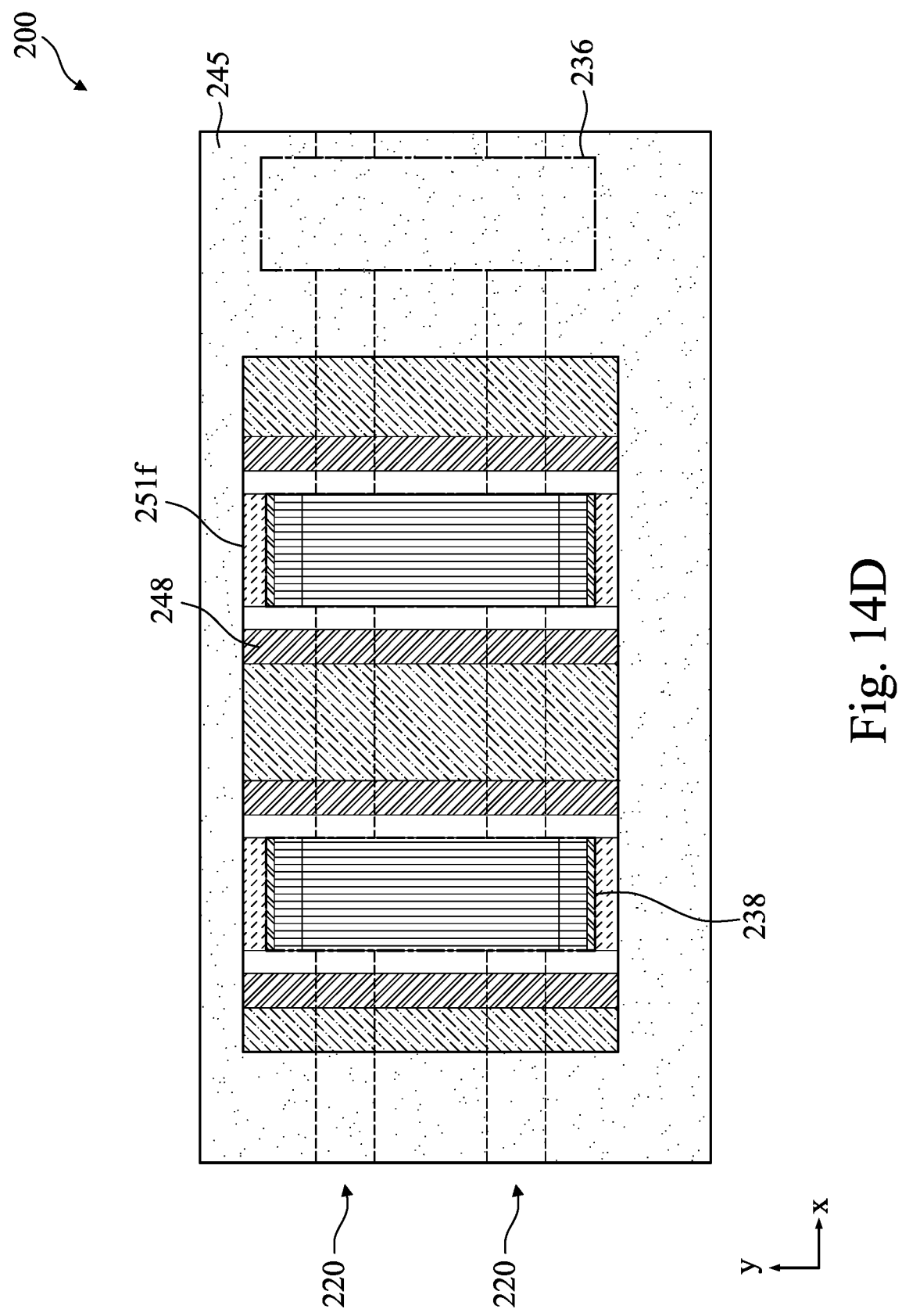

In operation 128, a silicide layer 252 is selectively formed over the exposed surfaces of the source/drain regions 236, as shown in FIGS. 14A-14D. FIG. 14A is a schematic cross sectional view of the semiconductor device 200 along A-A line of FIGS. 14B and 14C. FIG. 14B is a schematic cross sectional view of the semiconductor device 200 along B-B line of FIG. 14A. FIG. 14C is a schematic cross sectional view of the semiconductor device 200 along C-C line of FIG. 14A. FIG. 14D is a schematic plan view of the semiconductor device 200.

The silicide layer 252 conductively couples the source/drain regions 236 to the subsequently formed interconnect structures. The silicide layer 252 may be formed by depositing a metal source layer to cover exposed surfaces including the exposed surfaces of the epitaxial source/drain regions 236 and performing a rapid thermal annealing process. In some embodiments, the metal source layer includes a metal layer selected from but not limited Ti, Co, Ni, NiCo, Pt, Ni (Pt), Ir, Pt (Ir), Er, Yb, Pd, Rh, Nb, or TiSiN. After the formation of the metal source layer, a rapid thermal anneal process is performed, for example, a rapid anneal a rapid anneal at a temperature between about 700° C. and about 900° C. During the rapid anneal process, the portion of the metal source layer over the source/drain regions 236 reacts with silicon in the source/drain regions 236 to form the silicide layer 252. Unreacted portion of the metal source layer is then removed. In some embodiments, the silicide layer 236 has a thickness in a range between about 0.5 nm and 10 nm.

As shown in FIGS. 14C and 14D, the silicide layer 252 has a non-planar shape. Particularly, the silicide layer 252 wraps over an upper portion of the source/drain region 236. In some embodiments, the silicide layer 252 may be formed along grain line or facets of the epitaxial source/drain region 236.

Figure 15A:
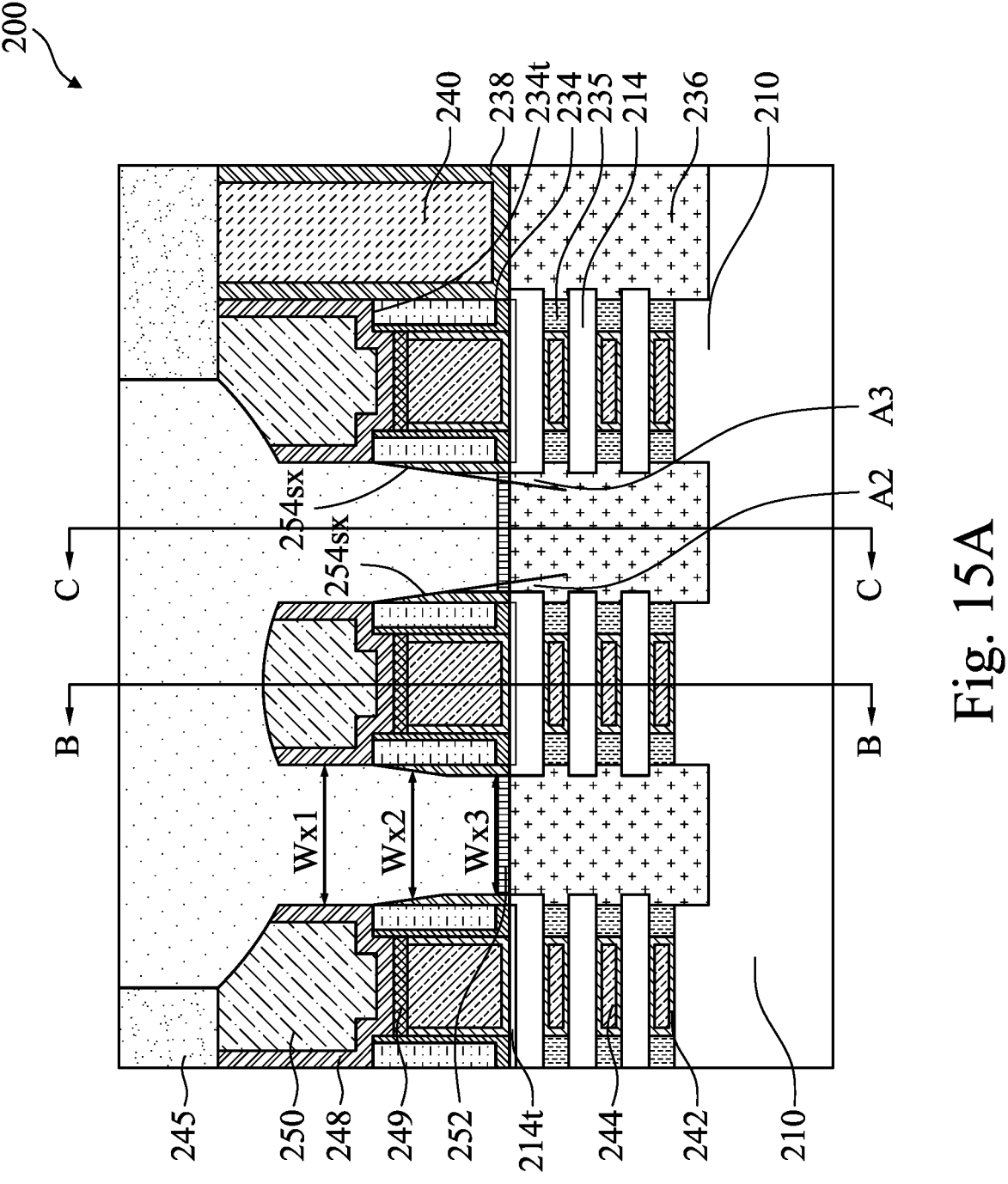
Figures 15B, 15C:
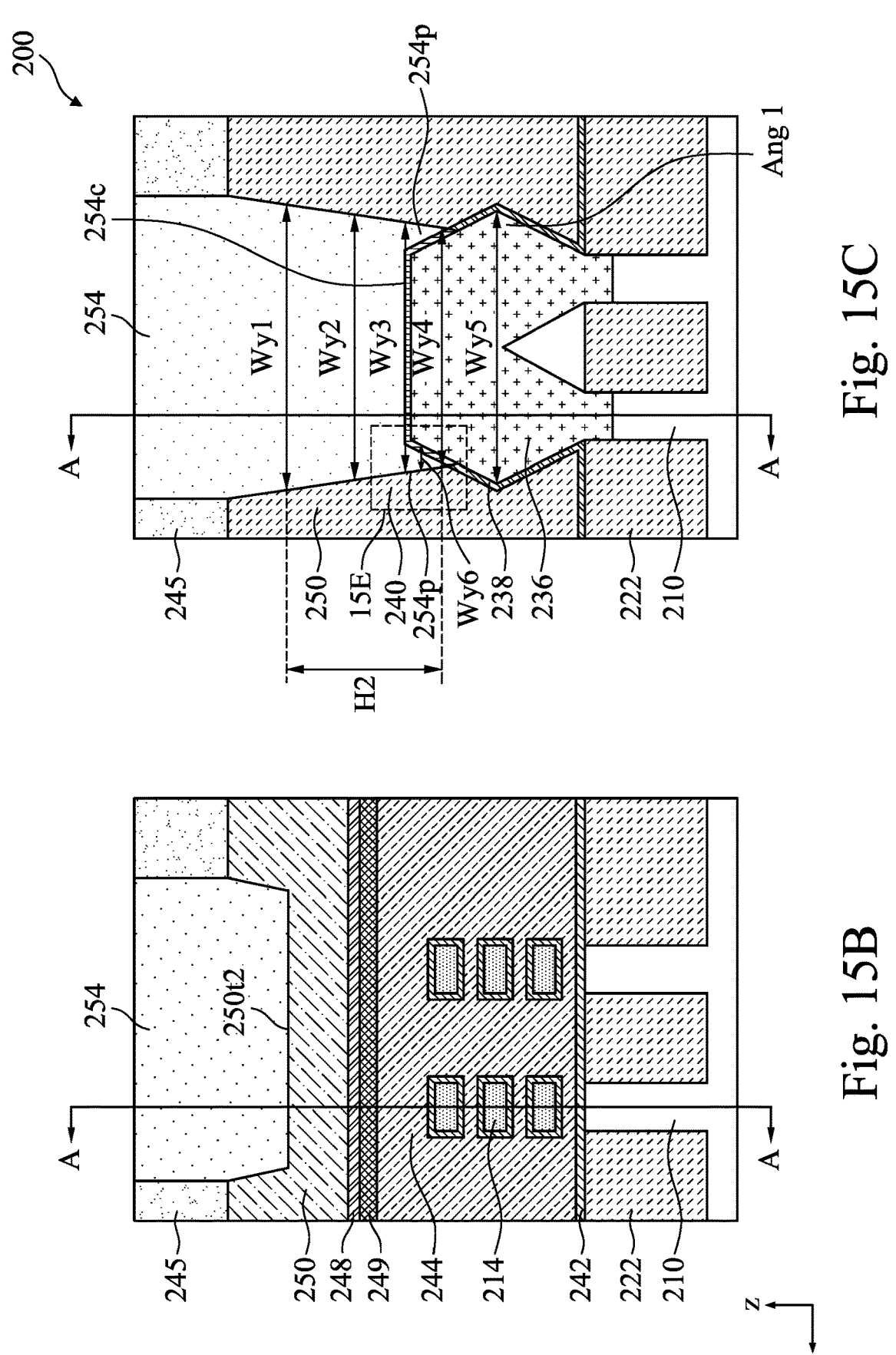
Figure 15D:
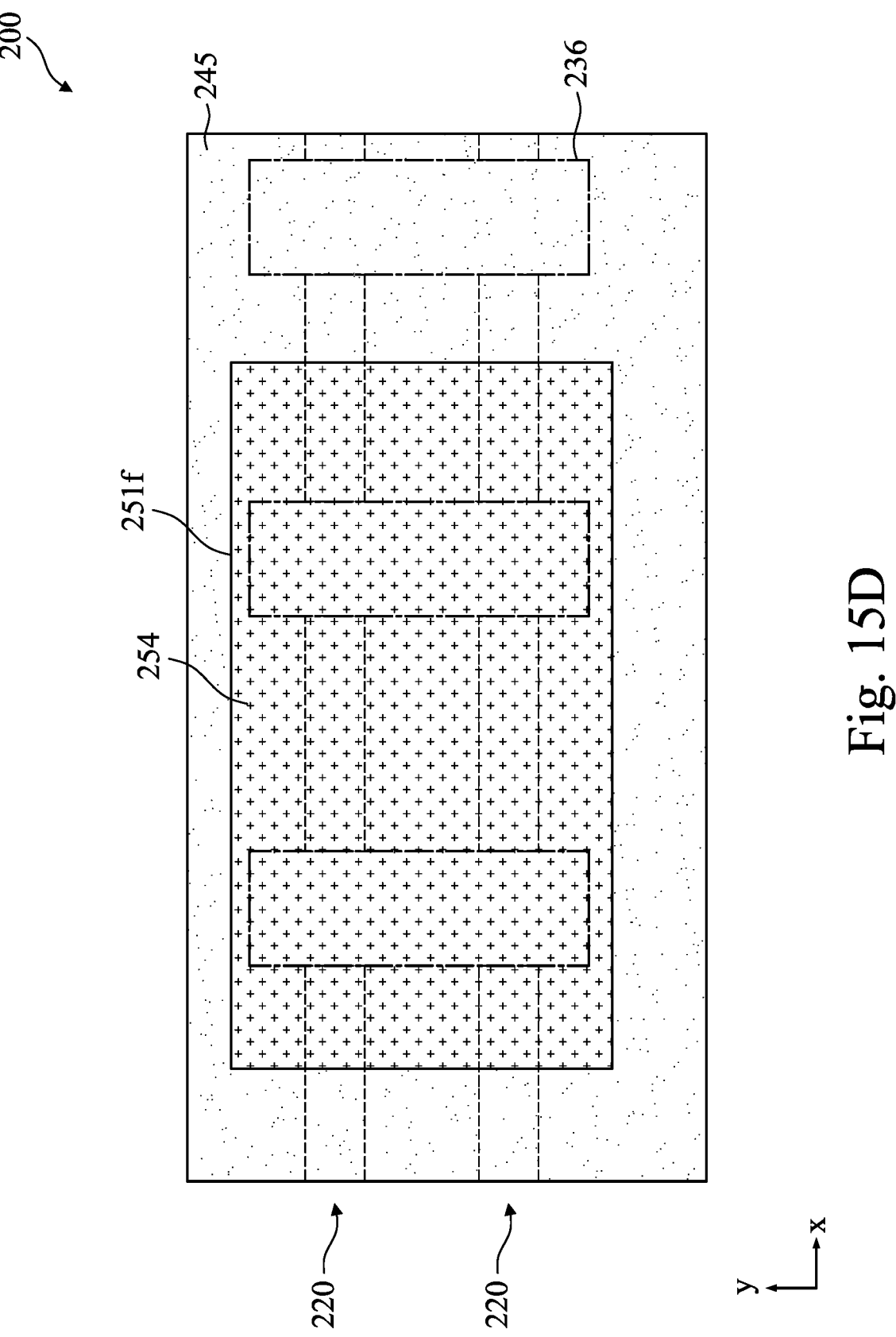

In operation 130, conductive material is deposited to fill contact openings 251*f* and form the source/drain contact features 254 as shown in FIGS. 15A-15E. FIG. 15A is a schematic cross sectional view of the semiconductor device 200 along A-A line of FIGS. 15B and 15C. FIG. 15B is a schematic cross sectional view of the semiconductor device 200 along B-B line of FIG. 15A. FIG. 15C is a schematic cross sectional view of the semiconductor device 200 along C-C line of FIG. 15A. FIG. 15D is a schematic plan view of the semiconductor device 200. FIG. 15E is a partial enlarged view of an area 15E in FIG. 15C.

In some embodiments, a barrier layer, not shown, may be formed over surfaces of the contact openings 251 prior to filling the source/drain contact features 254. In some embodiments, the barrier layer may be formed from Ti, Ta, TiN, TaN, W, Co, Ru, or the like. The barrier layer may have a thickness less than about 10 nm.

In some embodiments, the conductive material for the source/drain contact features 254 includes but limited to W, Co, Ru, Ti, Ni, Cu, Au, Ag, Pt, Pd, Ir, Os, Rh, Al, Mo, or the like. In some embodiments, the source/drain contact features 254 may be formed by a suitable deposition process, such as CVD, PVD, plating, ALD, or other suitable technique.

Subsequently, a CMP process is performed to remove a portion of the conductive material layer above a top surface of the second ILD layer 246.

The source/drain contact feature 254 according to present disclosure interfaces with the source/drain region 236 via a non-planar bottom profile, thus, reduces contact resistance with the source/drain region 236. The source/drain contact feature 254 has proximity regions 254*p*, shown in FIG. 15C, disposed below the top surface 236*t* of the source/drain region 236 and in electrical contact with the source/drain region 236 via the side surface 236*s*. FIG. 15E shows details of the proximity regions 254*p*.

Additionally, the contact opening 251*f* formed by the ALE process also has sloped sidewalls which prevent generation of gaps and seams during filling resulting in high quality conductive features. As shown in FIGS. 15C and 15A, dimensions of the source/drain contact features reduce with depth in both x-direction and y-direction.

As shown in FIG. 15C, the source/drain contact feature 254 has a width Wy1 near the top surface 250*t*2 of the SAC layer, a width Wy2 near the top surface 234*t* of the sidewall spacers 234, a width Wy3 near the top surface 236*t* of the source/drain region 236, a width Wy4 at level traversing the side surfaces 236*s* of the source/drain region 236. The proximity regions 254*p* has a width Wy6. The widths Wy1, Wy2, Wy3, Wy4 gradually decrease, i.e. the width Wy1 is greater than the width Wy2; the width Wy2 is greater than the width Wy3; and the width Wy3 is greater than the width Wy4. Width Wy5 indicates the widest portion of the source/drain region 236. The width Wy5 is equal to or greater than the width Wy4. Because the width Wy4 is less than the width Wy5, the proximity regions 254*p* of the source/drain contact feature 254 will not extrude below the widest portion of the source/drain region 236.

In some embodiments, the width Wy1 is in a range between about 65 nm and about 85 nm. The width Wy2 is in a range between 67 nm and about 85 nm. The width Wy3 is in a range between 55 nm and about 75 nm. The width Wy4 is in a range between 30 nm and about 66 nm. The width Wy5 is in a range between 50 nm and about 65 nm. The width Wy6 is in a range between 3 nm and about 10 nm. In some embodiments, a height H2, measured from the top surface 250*t*2 of the SAC layer 250 to the bottom of the proximity region 254*p*, may be in a range between about 70 nm and 80 nm. The height H2 may be referred to as the height of the source/drain contact feature.

As shown in FIG. 15E, the proximity region 254*p* may have a substantially triangular profile with a first side 254*s*1 in contact with the ILD layer 240 and a second side 254*s*2 in contact with the silicide layer 252. The first side 254*s*1 and the second side 254*s*2 meet at the tip of the proximity region 254*p* and form an angle A1. In some embodiments, the angle A1 is in a range between about 5° and about 60°

Even though the second side 254*s*2 of the proximity region 254*p* and the side surface 236*s* of the source/drain region 236 are shown at substantially linear in FIG. 15E, the second side 254*s*2 and the side surface 236*s* may be curved surfaces having a curvature in a range between about 0.5 and about 1.

As shown FIG. 15C, the source/drain contact feature 254 has a central side 254*c* facing the top surface 236*t* of the source/drain region 236. The central side 254*c* and the second side 254*s*2 from the proximity regions 254*p* form a non-linear bottom profile. The non-line bottom profile is a concave profile substantially matching to the convex profile of the source/drain region 236.

As shown in FIG. 15A, the source/drain contact feature 254 has a width Wx1 near the top surface 250t2 of the SAC layer, a width Wx2 near the top surface 234t of the sidewall spacers 234, a width Wx3 near the top surface 236t of the source/drain region 236. The widths Wx1, Wx2, Wx3 gradually decrease, i.e. the width Wx1 is greater than the width Wx2; the width Wx2 is greater than the width Wx3. In some embodiments, the width Wx1 is in a range between about 5 nm and about 30 nm. The width Wx2 is in a range between 5 nm and about 25 nm. The width Wx3 is in a range between 5 nm and about 10 nm. In FIG. 15A, the source/drain contact feature 254 has sloped sidewalls 254sx. The sidewall 254x may meet an edge of the source/drain region 236 at an angle A2 and meet an edge of the silicide at an angle A3. In some embodiments, the angle A2 is in a range between about 30° and about 60°. In some embodiments, the angle A3 is in a range between about 40° and about 60°

FIGS. 16, 17, and 18A-18C schematically illustrate various stages of manufacturing a semiconductor device 300 according to another embodiment of the present disclosure. The semiconductor device 300 is similar to the semiconductor device 200 except that the semiconductor device 300 includes FinFET structure without instead of GAA. The semiconductor device 300 may be fabricated using the method 100 as well.

FIG. 16 is a schematic perspective view of the semiconductor device 300 after operation 102. Fin structures 320 are formed by patterning and etching back the substrate 210.

Figure 17:
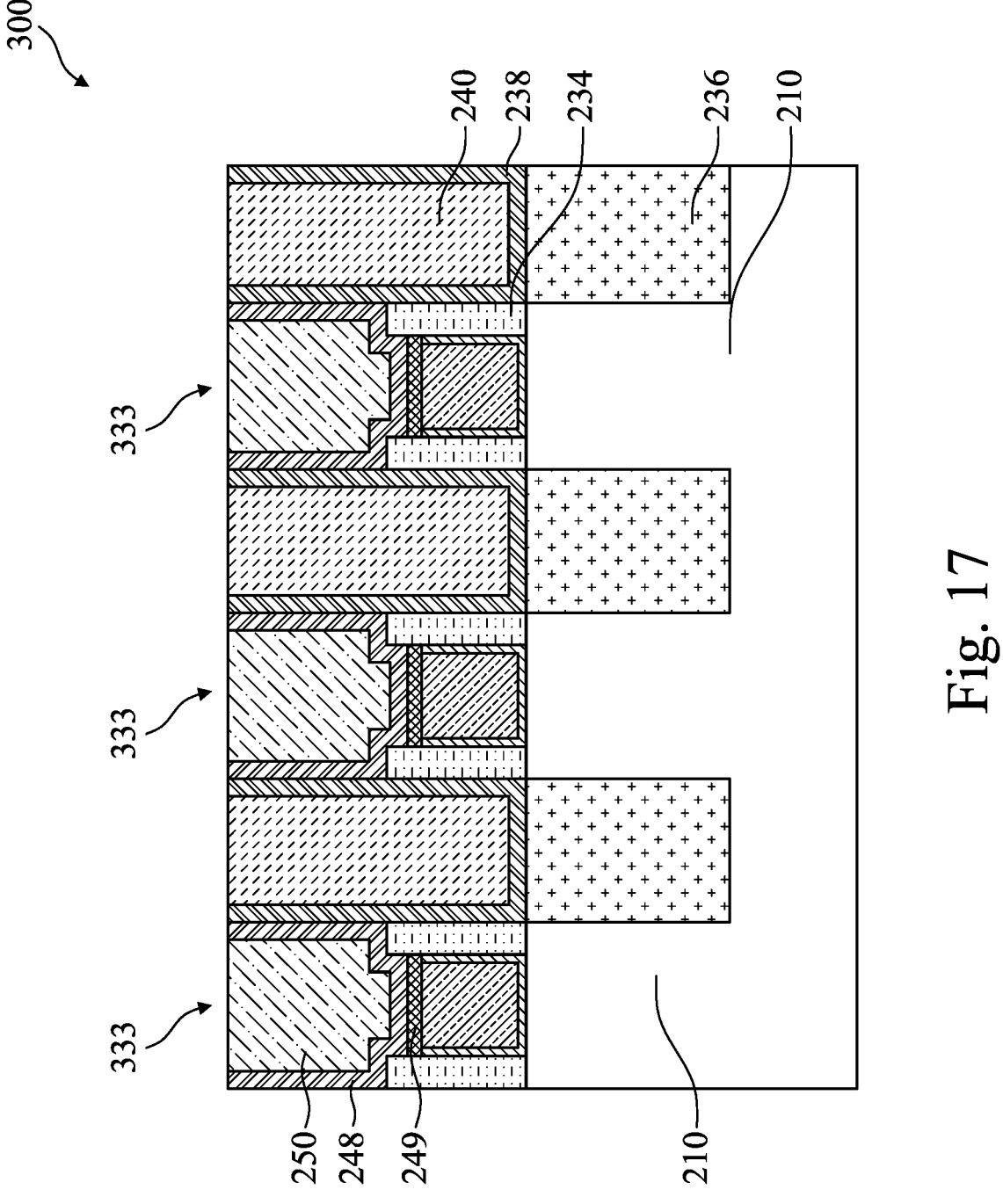
Figure 18A:
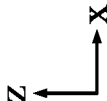
Figures 18B, 18C:
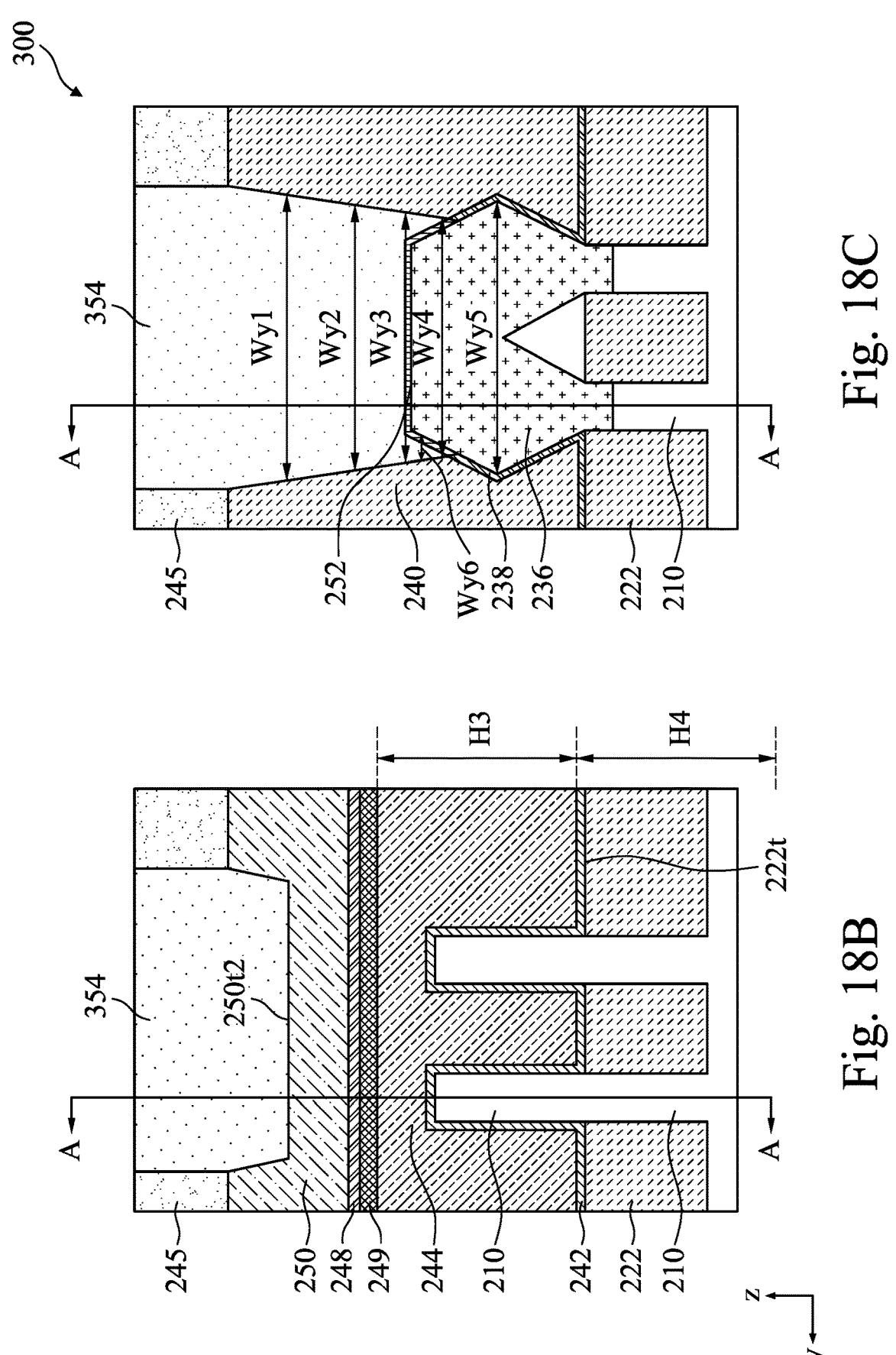

FIG. 17 is a cross sectional view of the semiconductor device 300 after operation 112. Gate structures 333 are formed over the fin structures 320. The selective ALE process as described in operations 118-126 are then performed to form the contact opening. A source/drain contact feature 354 is then filled int the contact opening as shown in FIG. 18A-18C. As shown in FIG. 18B, the gate structure 333 may have a gate height H3 measured from a top surface 222t of the isolation layer 222 to the top surface 250t2 of the SAC layer 250. Horizontal line 302 is at a height H4 from the top surface 222t of the isolation layer 222. The height H4 is about half of the gate height H3. In some embodiments, the bottom of the source/drain contact feature 354 is above the horizontal line 302 to prevent extrusion of the source/drain contact feature 354. In some embodiments, the fourth ALE operation performed during the operation 124 terminate when the contract opening is above the horizontal line 302, or the half gate height.

Figure 19:
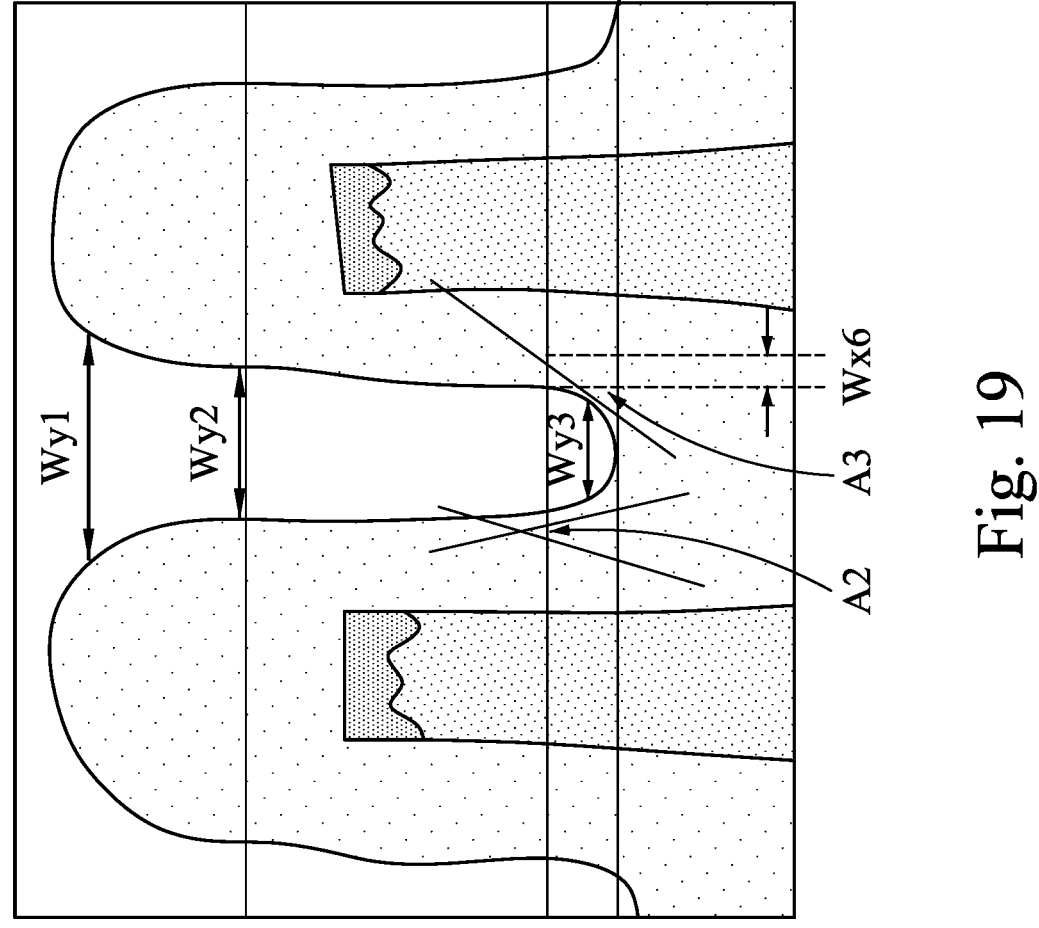
FIGS. 19-21 are schematic profiles of various semiconductor devices fabricated according to embodiments of the present disclosure.
Figure 20:
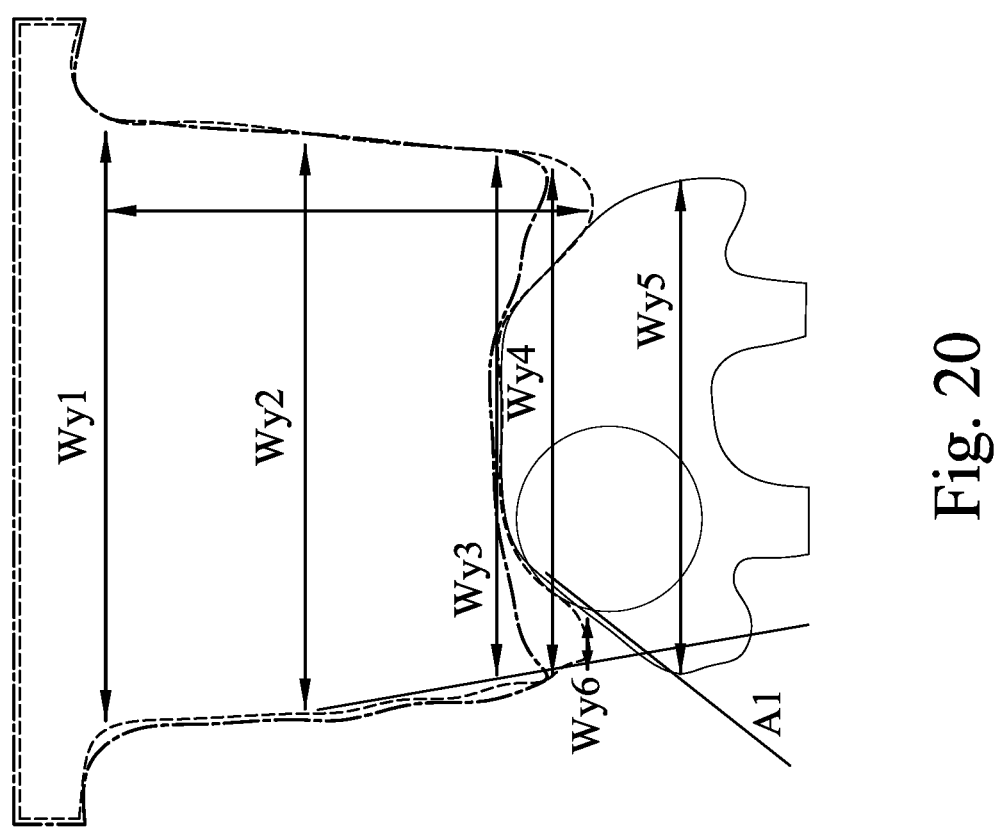
Figure 21:
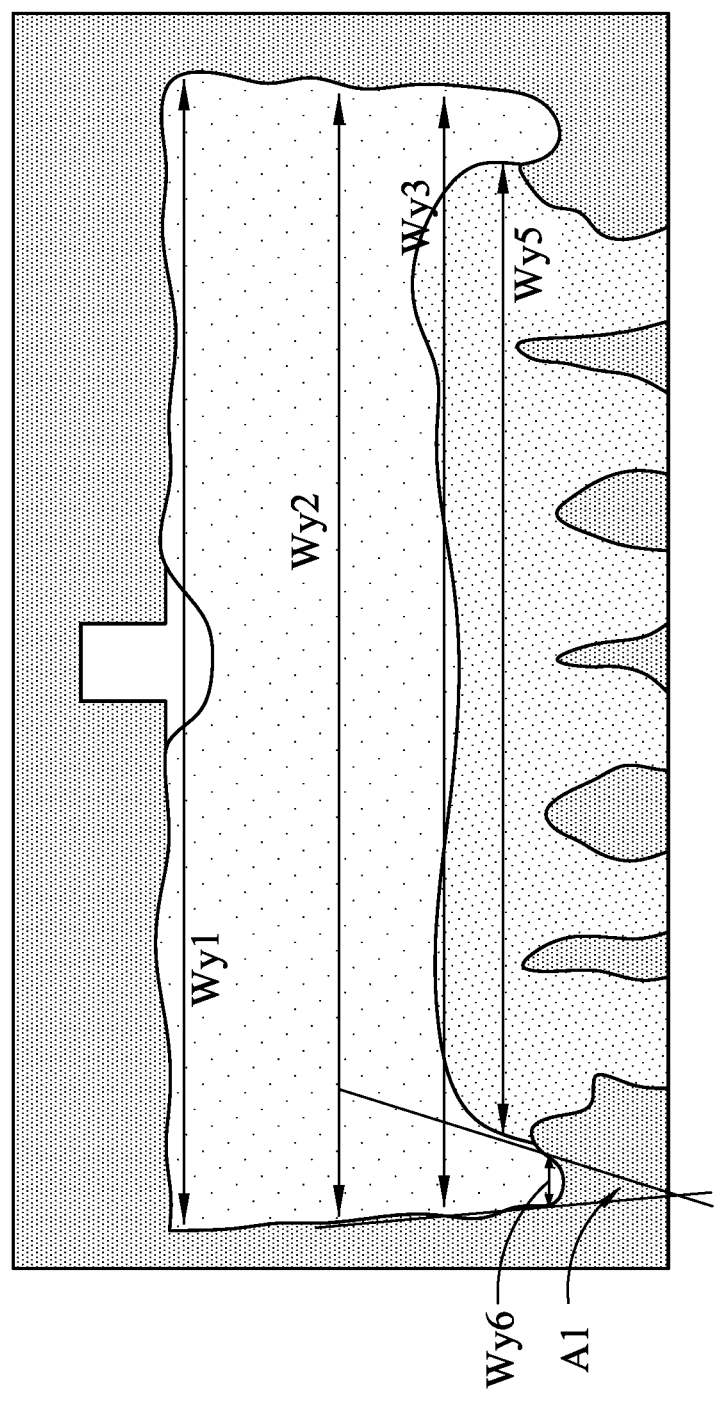

FIGS. 19-21 are schematic profiles of various semiconductor devices fabricated according to embodiments of the present disclosure. The source/drain contact features in FIG. 19-21 are fabricated using the selective ALE process according to the present disclosure. The source/drain contact features have curved contact surfaces which lead to reduced contact resistance.

FIG. 19 is a x-cut of a semiconductor device showing a source/drain contact feature across between two gate structures. The source/drain contact feature has gradually decreased width from the top for the SAC layer to the top of the source/drain feature. Sidewalls of the source/drain contact features are sloped.

FIG. 20 is a y-cut of a semiconductor device showing a source/drain contact feature formed over a source/drain region across two fin structures. The source/drain contact feature includes two proximity regions on either sides of the source/drain region. The source/drain feature has gradually decreased width from the top for the SAC layer to the top of the source/drain feature.

FIG. 21 is a y-cut of a semiconductor device showing a source/drain contact feature formed over a source/drain region across six fin structures. The source/drain contact feature includes two proximity regions on either sides of the source/drain region. The source/drain feature has gradually decreased width from the top for the SAC layer to the top of the source/drain feature. In the example of FIG. 21, the width Wy1 is in a range between about 66 nm and about 120 nm. The width Wy2 is in a range between 68 nm and about 120 nm. The width Wy3 is in a range between 56 nm and about 120 nm. The width Wy5 is in a range between 50 nm and about 100 nm. The width Wy6 is in a range between 3 nm and about 12 nm. The angle A1 is in a range between about 5° and about 40°

Embodiments of the present disclosure provide various advantages over existing technology. Embodiments of the present disclosure using multiple ALE operations with different plasma collimation (strike mode), reactive gases, and loading effects, to shape a bottom profile of the source/drain contact openings to increase the contact area.

It will be understood that not all advantages have been necessarily discussed herein, no particular advantage is required for all embodiments or examples, and other embodiments or examples may offer different advantages.

Some embodiments of the present provide a method for fabricating a semiconductor device, comprising: forming a fin structure along a first direction; forming two or more sacrificial gate structures along a second direction over the fin structure, wherein the second direction is perpendicular to the first direction; etching back the fin structure between the two or more sacrificial gate structures; forming a source/drain region between the two or more sacrificial gate structures, wherein a profile of the source/drain region along the second direction includes a top surface and two sloping side surfaces; depositing a CESL (contact etch stop layer) layer over the source/drain region, wherein the CESL layer covers the top surface and two side surfaces of the source/drain region; depositing an ILD (interlayer dielectric) layer over the CESL layer; forming replacement gate structures in place of the two or more sacrificial gate structures; etching back the ILD layer to a first level to expose the CESL layer formed on the top surface of the source/drain region; selectively etching the ILD layer along the side surfaces of the source/drain region to a second level to expose the CESL layer formed on the side surfaces of the source/drain regions; removing exposed portion of the CESL layers to expose the top surface and portions of the side surfaces of the source/drain region; forming a silicide layer on the top surface and the portions of the side surfaces of the source and drain region; and depositing a conductive material over the silicide layer.

Some embodiments of the present disclosure provide a method for fabricating a semiconductor device, comprising: depositing a mask layer over a semiconductor substrate comprising: a fin structure along a first direction; a first and a second gate structures along a second direction over the fin structure, wherein the second direction is perpendicular to the first direction; a source/drain region between the first and second gate structures, wherein the source/drain region has a convex upper profile along the second direction, and the convex upper profile includes a top surface, a first side surface and a second side surface, and the first side surface and the second side surface slope from the top surface; a CESL layer over the top surface, the first side surface and the second side surface of the source/drain region; and an ILD layer over the CESL layer; forming a first opening through the mask layer; etching the ILD layer through the first opening to expose the CESL layer on the top surface of the source/drain region; selectively etching the ILD layer along the first side surface and second side surface of the source/drain region; removing the exposed CESL layer; and forming a source/drain contact feature having a concave bottom profile matching the convex upper profile of the source/drain region.

Some embodiments of the present disclosure provide a semiconductor device, comprising: a fin structure along a first direction; a first and a second gate structures along a second direction over the fin structure, wherein the second direction is perpendicular to the first direction; a source/drain region between the first and second gate structures, wherein the source/drain region has a convex upper profile along the second direction, and the convex upper profile includes a top surface, a first side surface and a second side surface, and the first side surface and second side surface slope from the top surface; and a source/drain contact feature having first and second proximity regions facing the first side surface and second side surfaces of the source/drain region, wherein the source/drain contact feature has a concave bottom profile matching the convex upper profile of the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for fabricating a semiconductor device, comprising:

forming a fin structure along a first direction;

forming two or more sacrificial gate structures along a second direction over the fin structure, wherein the second direction is perpendicular to the first direction;

etching back the fin structure between the two or more sacrificial gate structures;

forming a source/drain region between the two or more sacrificial gate structures, wherein a profile of the source/drain region along the second direction includes a top surface and two sloping side surfaces;

depositing a CESL (contact etch stop layer) layer over the source/drain region, wherein the CESL layer covers the top surface and two side surfaces of the source/drain region;

depositing a first ILD (interlayer dielectric) layer over the CESL layer;

forming replacement gate structures in place of the two or more sacrificial gate structures;

performing a planarization process to form a planar surface including the replacement gate structures, the first ILD layer and the CESL layer;

depositing a second ILD layer over the top surface;

form a source/drain contact opening in a mask layer to expose a portion of the second ILD layer;

performing a first etch process through the source/drain contact opening to remove the second ILD layer and a portion of the first ILD layer;

terminating the first etch process when the second ILD layer is removed and the first ILD layer is etched at a first distance below the planar surface;

performing a second etch process to remove the first ILD layer and the CESL layer exposed in the source/drain contact opening;

terminating the second etch process when to a first level to expose the CESL layer formed on the top surface of the source/drain region is exposed;

selectively etching the first ILD layer along the side surfaces of the source/drain region to expose the CESL layer formed on the side surfaces of the source/drain regions;

removing exposed portion of the CESL layers to expose the top surface and portions of the side surfaces of the source/drain region;

forming a silicide layer on the top surface and the portions of the side surfaces of the source and drain region; and depositing a conductive material over the silicide layer.

2. The method of claim 1, wherein selective etching the first ILD layer along the side surfaces of the source/drain region comprises performing a first ALE (atomic layer etching) operation to selectively remove the first ILD layer.

3. The method of claim 2, wherein the first ALE operation comprises:

flowing a first reactant including $C_4F_6$, $O_2$, CO and Ar; and flowing a second reactant including $NF_3$ and $O_2$.

4. The method of claim 3, wherein the first ALE operation further comprises applying a plasma power and a bias power while flowing the first reactant and the second reactant.

5. The method of claim 4, wherein the plasma power and bias power are pulsed.

6. The method of claim 2, wherein performing the second etch process comprises performing a second ALE operation.

7. The method of claim 6, wherein the second ALE operation comprises:

flowing a third reactant including $C_4F_6$, $O_2$, CO and Ar;

flowing a fourth reactant including $NF_3$ and Ar; and flowing a fifth reactant including $NF_3$, $O_2$, and Ar.

8. The method of claim 7, wherein the second ALE operation further comprises: continuously applying a plasma power and a bias power while flowing the third, fourth, and fifth reactants.

9. A method for fabricating a semiconductor device, comprising:

depositing a mask layer over a semiconductor substrate comprising:

a fin structure along a first direction;

a first and a second gate structures along a second direction over the fin structure, wherein the second direction is perpendicular to the first direction;

a source/drain region between the first and second gate structures, wherein the source/drain region has a convex upper profile along the second direction, and the convex upper profile includes a top surface, a first side surface and a second side surface, the first side surface and the second side surface slope from the top surface towards a middle level, and the source/drain has a greatest width along the second direction at the middle level;

a CESL layer over the top surface, the first side surface and the second side surface of the source/drain region; and an ILD layer over the CESL layer;

forming a first opening through the mask layer;

etching the ILD layer through the first opening to expose the CESL layer on the top surface of the source/drain region;

selectively etching the ILD layer along the first side surface and second side surface of the source/drain region to a landing level, wherein the landing level is above the middle level;

removing the exposed CESL layer; and forming a source/drain contact feature having a concave bottom profile matching the convex upper profile of the source/drain region.

10. The method of claim 9, wherein the first gate structure comprises:

a SAC (self-aligned contact) layer disposed above a gate electrode layer, wherein a top surface of the SAC layer is at a first level; and a sidewall spacer, wherein a top surface of the sidewall spacer is at a second level below the first level, the top surface of the source/drain region is at a third level below the second level.

11. The method of claim 10, wherein etching the ILD layer comprises:

performing a first etching operation such that the ILD layer is near the first level;

performing a second etching operation such that the ILD layer is near the second level; and performing a third etching operation such that the ILD layer is near the third level.

12. The method of claim 11, wherein the first etching operation, the second etching operation and the third etching operation are ALE operations.

13. The method of claim 9, wherein selectively etching the ILD layer comprises: performing an ALE (atomic layer etching) operation to selectively remove the ILD layer.

14. The method of claim 13, wherein the ALE operation comprises sequentially:

flowing a first reactant including $C_4F_6$, $O_2$, CO and Ar; and flowing a second reactant including $NF_3$ and $O_2$.

15. The method of claim 11, wherein the first gate structure is exposed by the first opening after the first etching operation, and the SAC layer of the first gate structure is partially removed during the second etching operation.

16. A method for fabricating a semiconductor device, comprising:

depositing a mask layer over a semiconductor substrate comprising:

a fin structure along a first direction;

a first and a second gate structures along a second direction over the fin structure, wherein the second direction is perpendicular to the first direction;

a source/drain region disposed between the first and second gate structures;

a CESL layer disposed over the source/drain region;

a first ILD layer disposed over the CESL layer; and a second ILD layer disposed over a planar surface comprising the first ILD layer, the CESL layer and the first and second gate structures;

forming a source/drain opening through the mask layer;

performing a first etch process through the source/drain opening to remove the second ILD layer and a portion of the first ILD layer;

terminating the first etch process when the second ILD layer is removed and the first ILD layer is etched to a first level, wherein the first level at a first distance below the planar surface;

performing a second etch process to remove the first ILD layer and the CESL layer exposed in the source/drain contact opening;

terminating the second etch process when the CESL layer on a top surface of the source/drain region is exposed;

selectively etching back the first ILD layer along the source/drain region to a second level;

removing exposed portion of the CESL layers to expose the source/drain region;

forming a silicide layer on exposed portion of the source and drain region; and forming a source/drain contact feature in the source/drain opening.

17. The method of claim 16, wherein the fin structure includes two or more stacked semiconductor channels, and the second level is above a lower surface of a topmost semiconductor channel.

18. The method of claim 16, wherein the first distance is in a range between about 5 nm and about 20 nm.

19. The method of claim 16, wherein the first gate structure comprises:

a SAC (self-aligned contact) layer disposed above a gate electrode layer, wherein a top surface of the SAC layer is exposed to the planar surface, and a portion of the SAC layer is exposed by the first etching process and the SAC layer is etched back during the second etch process and the selective etching process.

20. The method of claim 16, wherein the second level is above a widest portion of the source/drain region.

* * * * *